(12) United States Patent
Ozawa et al.

(10) Patent No.: US 10,991,703 B2
(45) Date of Patent: Apr. 27, 2021

(54) SEMICONDUCTOR DEVICE

(71) Applicant: ROHM Co., LTD., Kyoto (JP)

(72) Inventors: Takanori Ozawa, Kyoto (JP); Hiroaki Ito, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 16/524,426

(22) Filed: Jul. 29, 2019

(65) Prior Publication Data
US 2020/0043937 A1 Feb. 6, 2020

(30) Foreign Application Priority Data

Aug. 1, 2018 (JP) .............................. JP2018-145302

(51) Int. Cl.
H01L 27/11507 (2017.01)
H01L 49/02 (2006.01)
H01L 27/11509 (2017.01)

(52) U.S. Cl.
CPC ........ *H01L 27/11507* (2013.01); *H01L 28/56* (2013.01); *H01L 28/57* (2013.01)

(58) Field of Classification Search
CPC .................... H01L 28/56–57; H01L 27/11507
See application file for complete search history.

(56) References Cited

U.S. PATENT DOCUMENTS

| 6,262,446 B1* | 7/2001 | Koo ................. H01L 21/76838 257/296 |
| 6,420,744 B1* | 7/2002 | Kim ................. H01L 27/11502 257/295 |
| 2016/0093627 A1* | 3/2016 | Sashida ................. H01L 23/585 257/532 |
| 2017/0179140 A1* | 6/2017 | Ozawa .................... H01L 28/00 |

FOREIGN PATENT DOCUMENTS

| JP | 2009-206942 A | 9/2009 |
| JP | 2014-103426 A | 6/2014 |

* cited by examiner

*Primary Examiner* — Herve-Louis Y Assouman
(74) *Attorney, Agent, or Firm* — Chip Law Group

(57) ABSTRACT

Provided is a semiconductor device that has a low interface resistance between a contact plug and a bottom electrode of a real ferroelectric capacitor. A real capacitor oxidation suppression structure ST including a dummy ferroelectric capacitor 312 and a second plug 311 is formed. The dummy ferroelectric capacitor 312 includes a second bottom electrode 51, a second ferroelectric film 52, and a second top electrode 53, and is not used as a nonvolatile memory element. The second bottom electrode 51 is formed on an interlayer insulating film 50. The second ferroelectric film 52 is formed on the second bottom electrode 51. The second top electrode 53 is formed on the second ferroelectric film 52. The second plug 311 penetrates the interlayer insulating film 50 and electrically connects the second bottom electrode 51 to a semiconductor substrate 40.

18 Claims, 46 Drawing Sheets

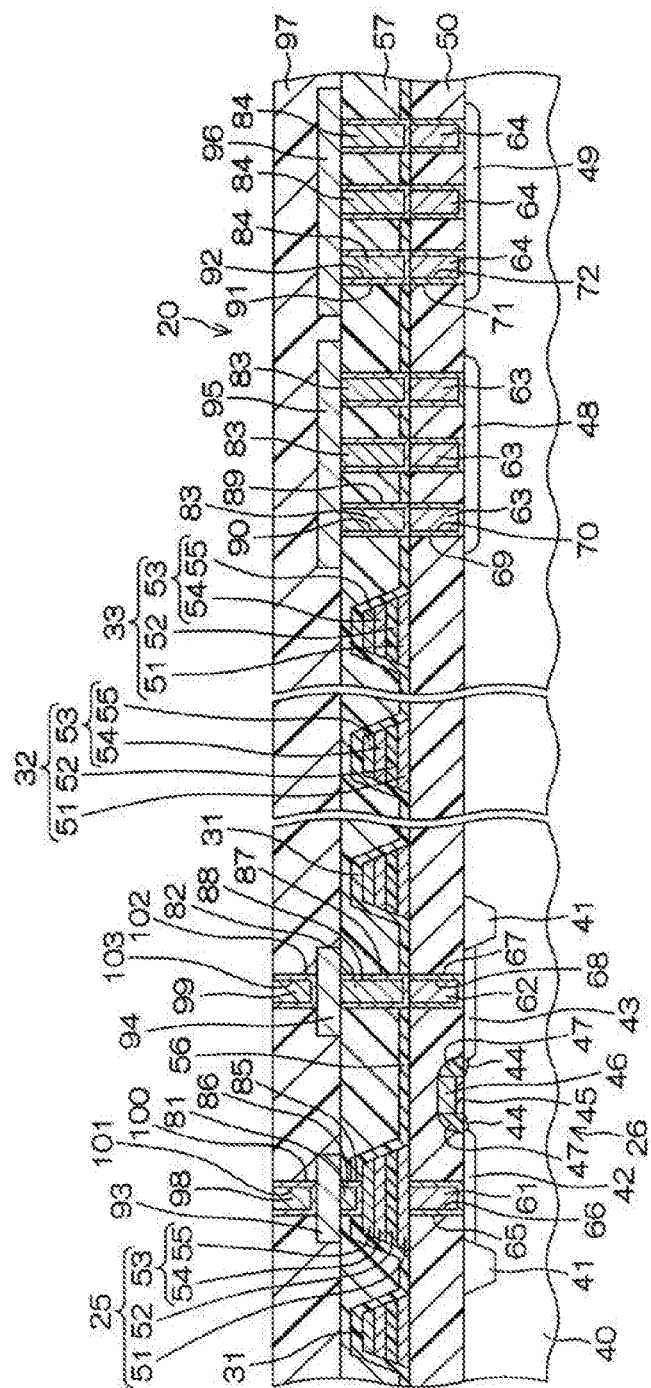

SEMICONDUCTOR DEVICE

CROSS REFERENCE TO RELATED APPLICATIONS

This US. application claims priority benefit of Japanese Patent Application No. 2018-145302 filed in the Japan Patent Office on Aug. 1, 2018. Each of the above-referenced applications is hereby incorporated herein by reference in its entirety.

TECHNICAL FIELD

The present invention relates to a semiconductor device that has a nonvolatile memory element including a ferroelectric capacitor.

BACKGROUND ART

A nonvolatile memory and a nonvolatile logic are known and used to store data by making use of hysteresis of ferroelectrics. A ferroelectric random access memory (Fe-RAM) is available as the nonvolatile memory. The ferroelectric random access memory includes a plurality of memory cells. As disclosed, for example, in Patent Document 1, the memory cells each include a field-effect transistor and a ferroelectric capacitor. Each of the memory cells in a ferroelectric random access memory is an example of a nonvolatile memory element including a ferroelectric capacitor.

As disclosed in Patent Document 2, the nonvolatile logic includes a plurality of nonvolatile logic cells (nonvolatile memory gates) and a control circuit for controlling the nonvolatile logic cells. The nonvolatile logic cells each include a volatile memory section and a nonvolatile memory section. The nonvolatile memory section retains data of the volatile memory section. The volatile memory section is formed, for example, of a flip-flop. The nonvolatile memory section includes, for example, a plurality of ferroelectric capacitors and a field-effect transistor provided for each of the ferroelectric capacitors. Each of the nonvolatile logic cells is an example of a nonvolatile memory element including a ferroelectric capacitor. When, for example, power supply is to be shut off, the control circuit backs up data from the volatile memory section to the nonvolatile memory section. Meanwhile, when the power supply is turned on, the control circuit restores the data from the nonvolatile memory section to the volatile memory section.

PRIOR ART DOCUMENT

Patent Documents

[Patent Document 1]
Japanese Patent Laid-Open No. 2014-103426
[Patent Document 2]
Japanese Patent Laid-Open No. 2009-206942

SUMMARY OF THE INVENTION

Problem to be Solved by the Invention

The ferroelectric capacitor used in the abovementioned ferroelectric random access memory or nonvolatile logic is formed, for example, on an interlayer insulating film that is formed on a semiconductor substrate. The ferroelectric capacitor is structured such that a bottom electrode, a ferroelectric film, and a top electrode are layered over the interlayer insulating film in the order named. The bottom electrode of the ferroelectric capacitor is electrically connected to a drain region (source region) formed on a surface layer of the semiconductor substrate through a contact plug penetrating the interlayer insulating film.

If a high interface resistance is exhibited between the contact plug and the bottom electrode of the ferroelectric capacitor, the charging/discharging time of the ferroelectric capacitor is adversely affected. It is therefore preferable that the interface resistance between the contact plug and the bottom electrode of the ferroelectric capacitor be minimized.

An object of the present invention is to provide a semiconductor device that has a low interface resistance between a contact plug and a bottom electrode of a real ferroelectric capacitor.

Means for Solving the Problem

A semiconductor device according to the present invention includes a semiconductor substrate, an interlayer insulating film that is formed on the semiconductor substrate, and a nonvolatile memory element that includes a real ferroelectric capacitor formed on the interlayer insulating film. The real ferroelectric capacitor includes a first bottom electrode formed on the interlayer insulating film, a first ferroelectric film formed on the first bottom electrode, and a first top electrode formed on the first ferroelectric film. The first bottom electrode of the real ferroelectric capacitor is electrically connected to the semiconductor substrate through a first plug penetrating the interlayer insulating film. A real capacitor oxidation suppression structure including a dummy ferroelectric capacitor and a second plug is formed. The dummy ferroelectric capacitor includes a second bottom electrode, a second ferroelectric film, and a second top electrode, and is not used as a nonvolatile memory element. The second bottom electrode is formed on the interlayer insulating film. The second ferroelectric film is formed on the second bottom electrode. The second top electrode is formed on the second ferroelectric film. The second plug penetrates the interlayer insulating film and electrically connects the second bottom electrode to the semiconductor substrate.

The inventors of the present invention have found a factor that increases the interface resistance between the contact plug and the bottom electrode of the real ferroelectric capacitor. More specifically, when plasma is generated in a semiconductor device manufacturing process, charged particles in the plasma pass through a first conductive path that includes the bottom electrode of the real ferroelectric capacitor (first bottom electrode), the first plug, and the semiconductor substrate. As this causes a large current flow in the first conductive path, the junction between the first plug and the bottom electrode of the real ferroelectric capacitor is oxidized to increase the interface resistance between the first plug and the bottom electrode of the real ferroelectric capacitor. The larger the current flow in the first conductive path, the higher the degree of oxidation.

For the above-described configuration, the real capacitor oxidation suppression structure is adopted. Therefore, when plasma is generated in the semiconductor device manufacturing process, the charged particles in the plasma pass through a second conductive path that includes the bottom electrode of the dummy ferroelectric capacitor (second bottom electrode), the second plug, and the semiconductor substrate. In other words, a current additionally flows in the second conductive path. Therefore, as compared to a case where the real capacitor oxidation suppression structure is not formed, the current flow in the first conductive path can be decreased. This makes it possible to suppress the oxidation of the junction between the first plug and the bottom electrode of the real ferroelectric capacitor (first bottom electrode). Consequently, the interface resistance between the first plug and the first bottom electrode can be decreased.

In an embodiment of the present invention, the nonvolatile memory element includes a transistor formed on the semiconductor substrate, the first bottom electrode of the real ferroelectric capacitor is connected to the transistor, and the second bottom electrode of the dummy ferroelectric capacitor is not connected to the transistor.

In an embodiment of the present invention, the real capacitor oxidation suppression structure is formed in a ring-like or substantially ring-like manner as viewed from above.

In an embodiment of the present invention, a seal ring having a ring-like shape as viewed from above is formed on a periphery of the semiconductor device as viewed from above in order to prevent entry of moisture. The real capacitor oxidation suppression structure is formed as a part of the seal ring.

In an embodiment of the present invention, the real capacitor oxidation suppression structure includes the dummy ferroelectric capacitor having a ring-like shape as viewed from above and the second plug having a ring-like shape as viewed from above.

In an embodiment of the present invention, the seal ring includes a first seal ring and a second seal ring. The first seal ring is ring-like in shape as viewed from above. The second seal ring is ring-like in shape as viewed from above and formed so as to surround the first seal ring. The real capacitor oxidation suppression structure is formed as a part of the first seal ring.

In an embodiment of the present invention, the real capacitor oxidation suppression structure forming a part of the first seal ring includes the dummy ferroelectric capacitor having a ring-like shape as viewed from above and the second plug having a ring-like shape as viewed from above.

In an embodiment of the present invention, the seal ring includes a first seal ring and a second seal ring. The first seal ring is ring-like in shape as viewed from above. The second seal ring is ring-like in shape as viewed from above and formed so as to surround the first seal ring. The real capacitor oxidation suppression structure is formed as a part of the second seal ring.

In an embodiment of the present invention, the real capacitor oxidation suppression structure forming a part of the second seal ring includes the dummy ferroelectric capacitor having a ring-like shape as viewed from above and the second plug having a ring-like shape as viewed from above.

In an embodiment of the present invention, the seal ring includes a first seal ring and a second seal ring. The first seal ring is ring-like in shape as viewed from above. The second seal ring is ring-like in shape as viewed from above and formed so as to surround the first seal ring. The real capacitor oxidation suppression structure is not only formed as a part of the first seal ring, but also formed as a part of the second seal ring.

In an embodiment of the present invention, the real capacitor oxidation suppression structure forming a part of the first seal ring includes the dummy ferroelectric capacitor having a ring-like shape as viewed from above and the second plug having a ring-like shape as viewed from above, and the real capacitor oxidation suppression structure forming a part of the second seal ring includes the dummy ferroelectric capacitor having a ring-like shape as viewed from above and the second plug having a ring-like shape as viewed from above.

In an embodiment of the present invention, when the interlayer insulating film is regarded as a first interlayer insulating film, a hydrogen barrier film that covers a surface of the real ferroelectric capacitor, a surface of the dummy ferroelectric capacitor, and a surface of the first interlayer insulating film, and a second interlayer insulating film that is formed on the hydrogen barrier film are further included. The seal ring further includes a shield wiring that is ring-like in shape as viewed from above and formed on the second interlayer insulating film, and a shield plug that is ring-like in shape as viewed from above, embedded in the second interlayer insulating film, and used to electrically connect a top electrode of the real capacitor oxidation suppression structure to the shield wiring.

In an embodiment of the present invention, when the interlayer insulating film is regarded as a first interlayer insulating film, a hydrogen barrier film that covers a surface of the real ferroelectric capacitor, a surface of the dummy ferroelectric capacitor, and a surface of the first interlayer insulating film, and a second interlayer insulating film that is formed on the hydrogen barrier film are further included. The first seal ring further includes a shield wiring that is ring-like in shape as viewed from above and formed on the second interlayer insulating film, and a shield plug that is ring-like in shape as viewed from above, embedded in the second interlayer insulating film, and used to electrically connect a top electrode of the real capacitor oxidation suppression structure to the shield wiring.

In an embodiment of the present invention, when the interlayer insulating film is regarded as a first interlayer insulating film, a hydrogen barrier film that covers a surface of the real ferroelectric capacitor, a surface of the dummy ferroelectric capacitor, and a surface of the first interlayer insulating film, and a second interlayer insulating film that is formed on the hydrogen barrier film are further included. The second seal ring further includes a shield wiring that is ring-like in shape as viewed from above and formed on the second interlayer insulating film, and a shield plug that is ring-like in shape as viewed from above, embedded in the second interlayer insulating film, and used to electrically connect a top electrode of the real capacitor oxidation suppression structure to the shield wiring.

In an embodiment of the present invention, when the interlayer insulating film is regarded as a first interlayer insulating film, a hydrogen barrier film that covers a surface of the real ferroelectric capacitor, a surface of the dummy ferroelectric capacitor, and a surface of the first interlayer insulating film, and a second interlayer insulating film that is formed on the hydrogen barrier film are further included. The first seal ring further includes a first shield wiring that is ring-like in shape as viewed from above and formed on the second interlayer insulating film, and a first shield plug that is ring-like in shape as viewed from above, embedded in the second interlayer insulating film, and used to electrically connect a top electrode of the real capacitor oxidation suppression structure to the first shield wiring. The second seal ring further includes a second shield wiring that is ring-like in shape as viewed from above and formed on the second interlayer insulating film, and a second shield plug that is ring-like in shape as viewed from above, embedded in the second interlayer insulating film, and used to electrically connect the top electrode of the real capacitor oxidation suppression structure to the second shield wiring.

In an embodiment of the present invention, the semiconductor substrate is of a first conductive type, the first plug is electrically connected to a second conductive diffusion region formed on a surface layer of the semiconductor substrate, and the second plug is electrically connected to a first conductive diffusion region formed on a surface layer of the semiconductor substrate.

In an embodiment of the present invention, the first conductive type is a p-type, and the second conductive type is an n-type.

In an embodiment of the present invention, the nonvolatile memory element is a nonvolatile logic cell that includes a volatile memory section and a nonvolatile memory section. The nonvolatile memory section includes the real ferroelectric capacitor and retains data of the volatile memory section.

In an embodiment of the present invention, the nonvolatile memory element is a memory cell in a ferroelectric random access memory.

BRIEF DESCRIPTION OF THE DRAWINGS

FIG. 8O is a schematic cross-sectional view illustrating a process subsequent to the process illustrated in FIG. 8N.

FIG. 8P is a schematic cross-sectional view illustrating a process subsequent to the process illustrated in FIG. 8O.

FIG. 9I is a schematic cross-sectional view illustrating a process subsequent to the process illustrated in FIG. 9H.

FIG. 9O is a schematic cross-sectional view illustrating a process subsequent to the process illustrated in FIG. 9N.

MODES FOR CARRYING OUT THE INVENTION

Embodiments of the present invention will now be described in detail with reference to the accompanying drawings.

Figure 1:
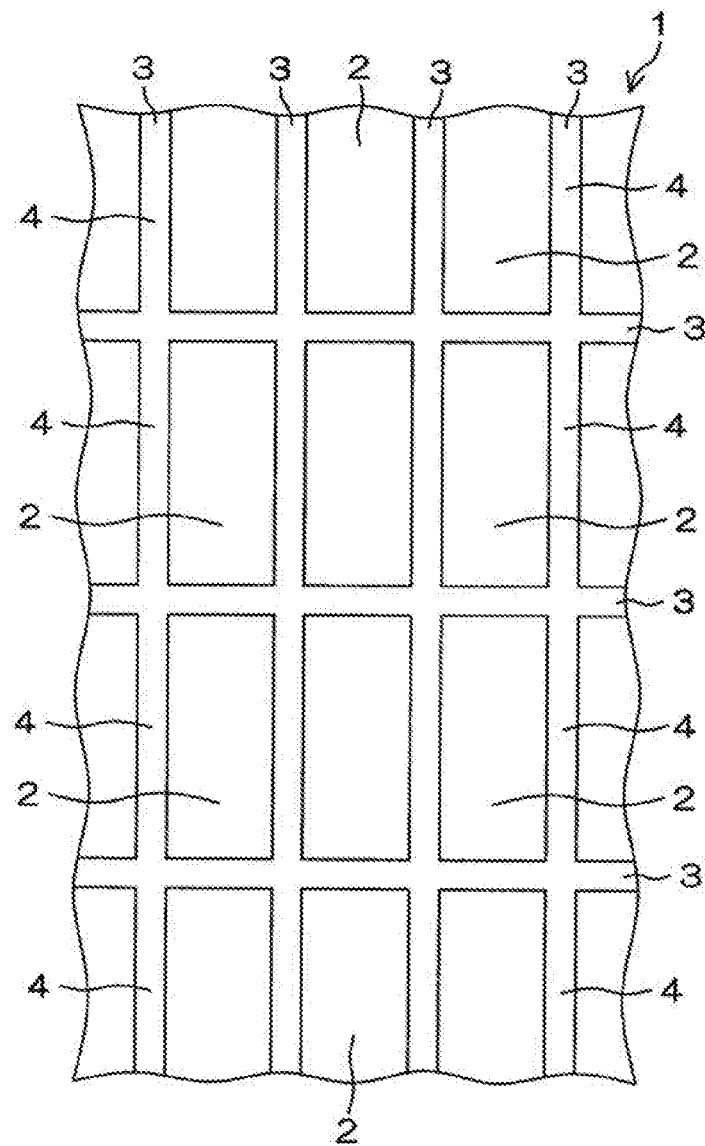
FIG. 1 is an illustrative plan view of a semiconductor wafer that has been subjected to wafer processing for producing a semiconductor device according to an embodiment of the present invention.

FIG. 1 is an illustrative plan view of a semiconductor wafer that has been subjected to wafer processing for producing a semiconductor device according to an embodiment of the present invention. The semiconductor wafer 1 includes a plurality of functional element regions 2 and a scribe region 3. The scribe region 3 is formed so as to surround each functional element region 2. In the plan view of FIG. 1, each functional element region 2 is rectangular in shape. In the plan view of FIG. 1, the functional element regions 2 are arranged in a matrix pattern at spaced intervals in both the vertical and horizontal directions. A portion between neighboring functional element regions 2 is the scribe region 3. The semiconductor wafer 1 is cut along the scribe region 3 by a dicing blade. As a result, a semiconductor device (chip) 4 including a functional element region 2 is cut out. The semiconductor device 4 includes the scribe region 3 on the periphery and the functional element region 2 within a central region surrounded by the scribe region 3.

Figure 2:
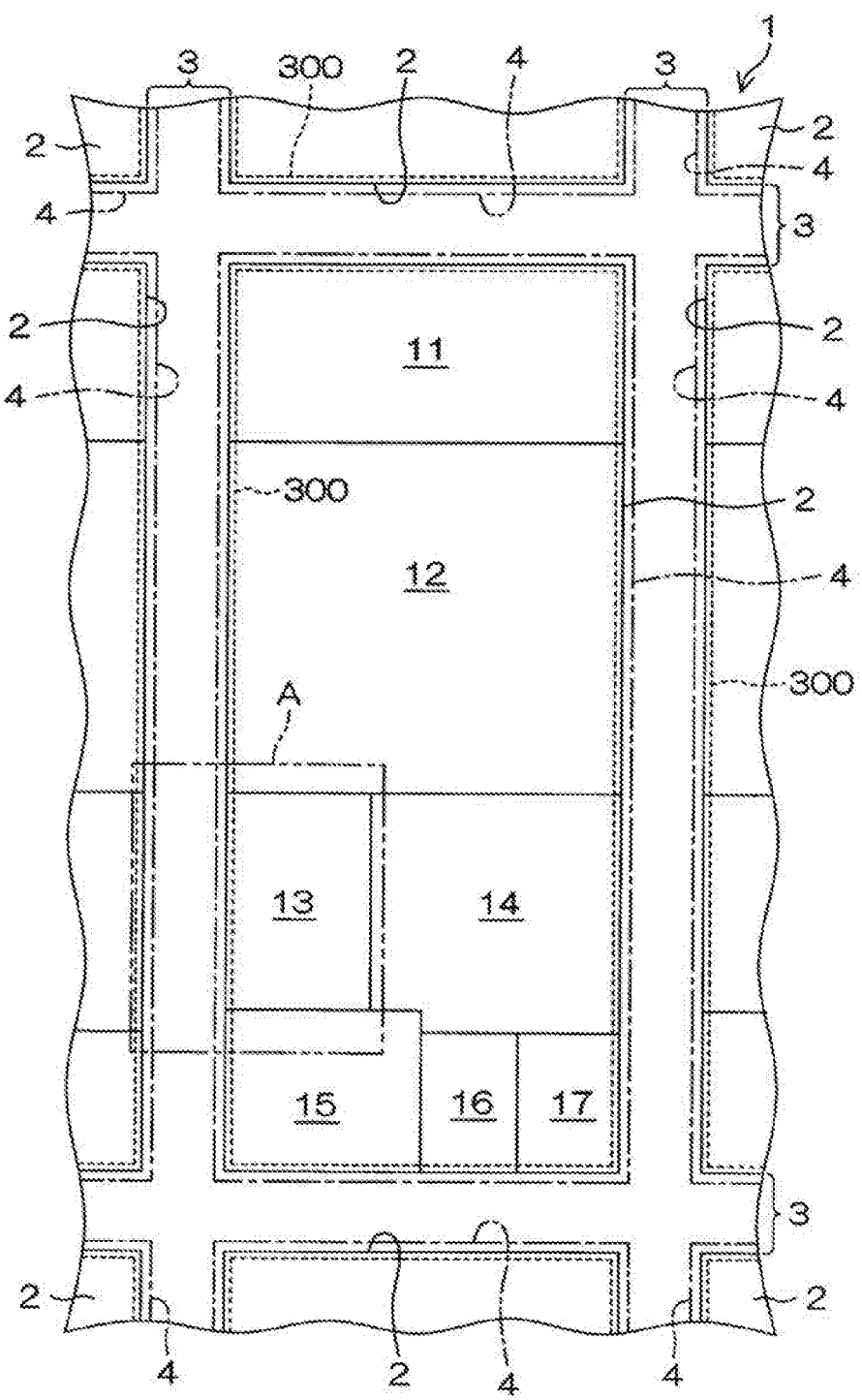
FIG. 2 is a partially enlarged plan view of a part of FIG. 1.

FIG. 2 is a partially enlarged plan view of a part of FIG. 1.

Formed in the functional element region 2 are functional elements that perform the functions of the semiconductor device 4. In the present embodiment, the functional element region 2 includes, for example, a power transistor region 11, an analog circuit region 12, a nonvolatile logic region 13, a logic region 14, an SRAM region 15, a CPU region 16, and a ROM region 17. A power transistor is formed in the power transistor region 11.

An analog circuit is formed in the analog circuit region 12. A nonvolatile logic is formed in the nonvolatile logic region 13. A logic circuit is formed in the logic region 14. An SRAM is formed in the SRAM region 15. A CPU is formed in the CPU region 16. A ROM is formed in the ROM region 17. The nonvolatile logic region 13 may be included in the logic region 14.

When the semiconductor wafer 1 is cut along the scribe region 3 by a dicing blade to obtain a chip, the periphery of the chip may become cracked or chipped. If the periphery of the chip is cracked or chipped, moisture is likely to enter from the outside. In view of such circumstances, the present embodiment is configured so that a shield ring 300 shaped like a rectangular ring as viewed from above is formed on the periphery of the functional element region 2.

Figure 3:
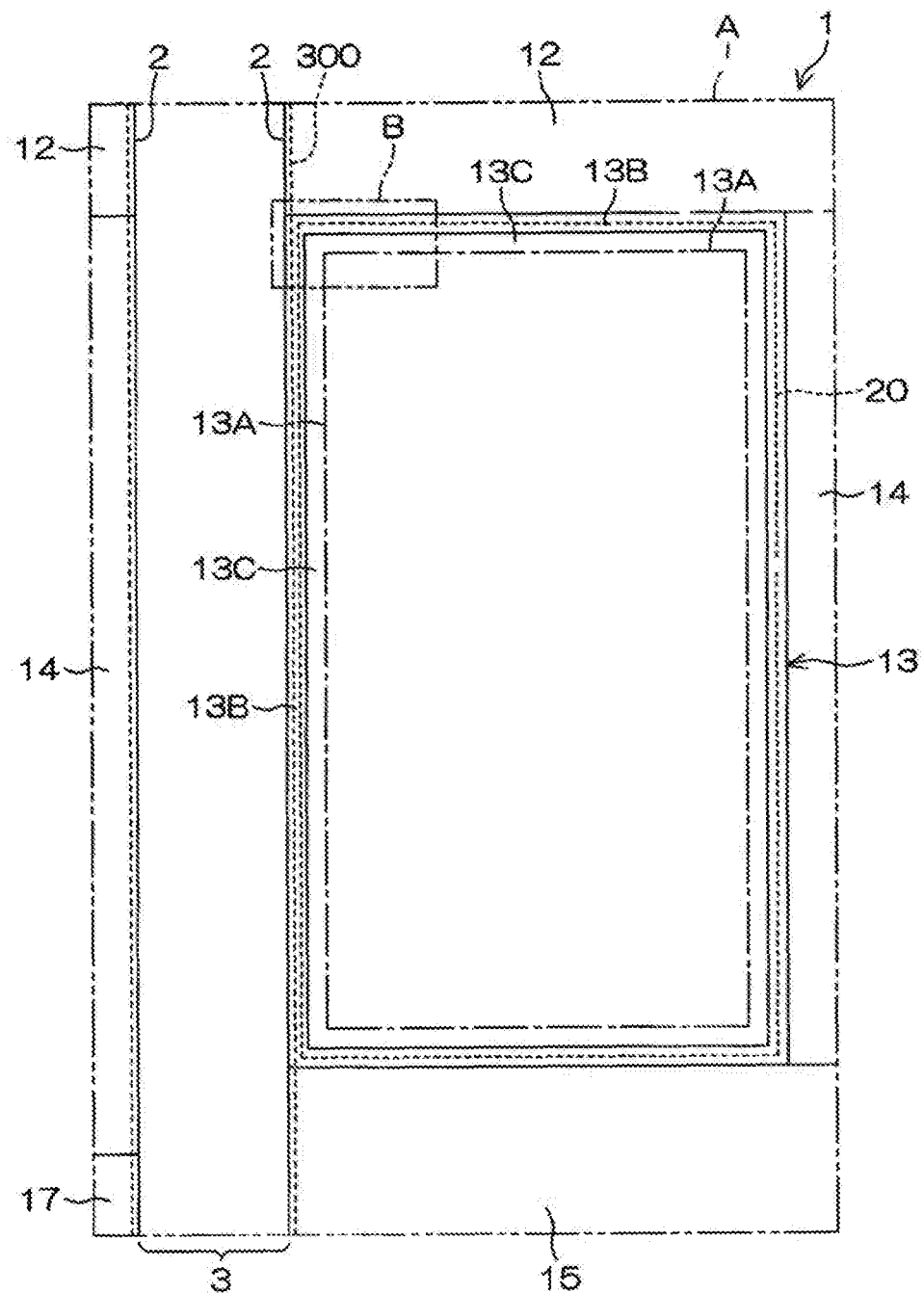
FIG. 3 is a partially enlarged plan view of part A in FIG. 2.

FIG. 3 is a partially enlarged plan view of part A in FIG. 2.

The nonvolatile logic region 13 includes a core region 13A, a guard ring region 13B, and a region shaped like a rectangular ring as viewed from above (hereinafter referred to as "gap region 13C"). The core region 13A is shaped like a rectangle as viewed from above, and is a region where the nonvolatile logic is formed. The guard ring region 13B is shaped like a rectangular ring as viewed from above and formed so as to surround the core region 13A. The gap region 13C is disposed between the core region 13A and the guard ring region 13B.

A guard ring 20 is formed in the guard ring region 13B. The guard ring 20 is formed so as to surround the periphery of the nonvolatile logic region 13. In the guard ring region 13B along the scribe region 3, the guard ring 20 is formed inside the shield ring 300.

Figure 4:
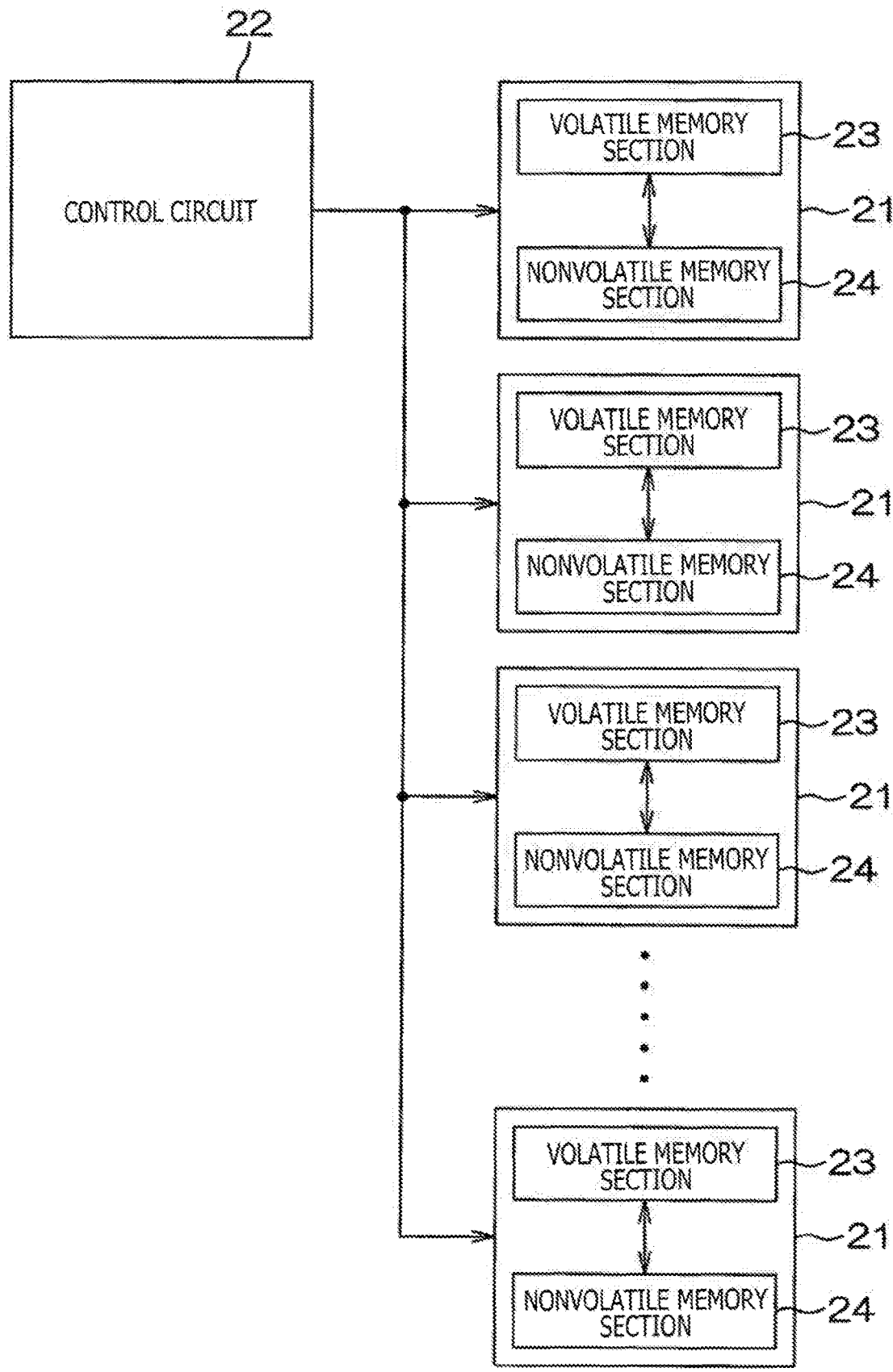
FIG. 4 is a block diagram illustrating an electrical configuration of a nonvolatile logic.

FIG. 4 is a block diagram illustrating an electrical configuration of the nonvolatile logic.

The nonvolatile logic includes a plurality of nonvolatile logic cells (nonvolatile memory elements) 21 and a control circuit 22. The control circuit 22 controls the nonvolatile logic cells 21. In the present embodiment, the nonvolatile logic cells 21 each include a volatile memory section 23 and a nonvolatile memory section 24. The nonvolatile memory section 24 stores data (status) of the volatile memory section 23. The volatile memory section 23 in the present embodiment is formed of a flip-flop. The nonvolatile memory section 24 in the present embodiment includes a plurality of ferroelectric capacitors (e.g., four ferroelectric capacitors) and a MOS field-effect transistor (MOSFET: Metal Oxide Semiconductor Field Effect Transistor). The MOS field-effect transistor is provided for each ferroelectric capacitor.

When, for example, power supply is to be shut off, the control circuit 22 backs up data from the volatile memory section 23 to the nonvolatile memory section 24. Meanwhile, when the power supply is turned on, the control circuit 22 restores the data from the nonvolatile memory section 24 to the volatile memory section 23. Each of the nonvolatile logic cells 21 is an example of a nonvolatile memory element according to the present invention. The nonvolatile memory gate disclosed in Patent Document 2 can be used as a nonvolatile logic cell 21.

Figure 5:
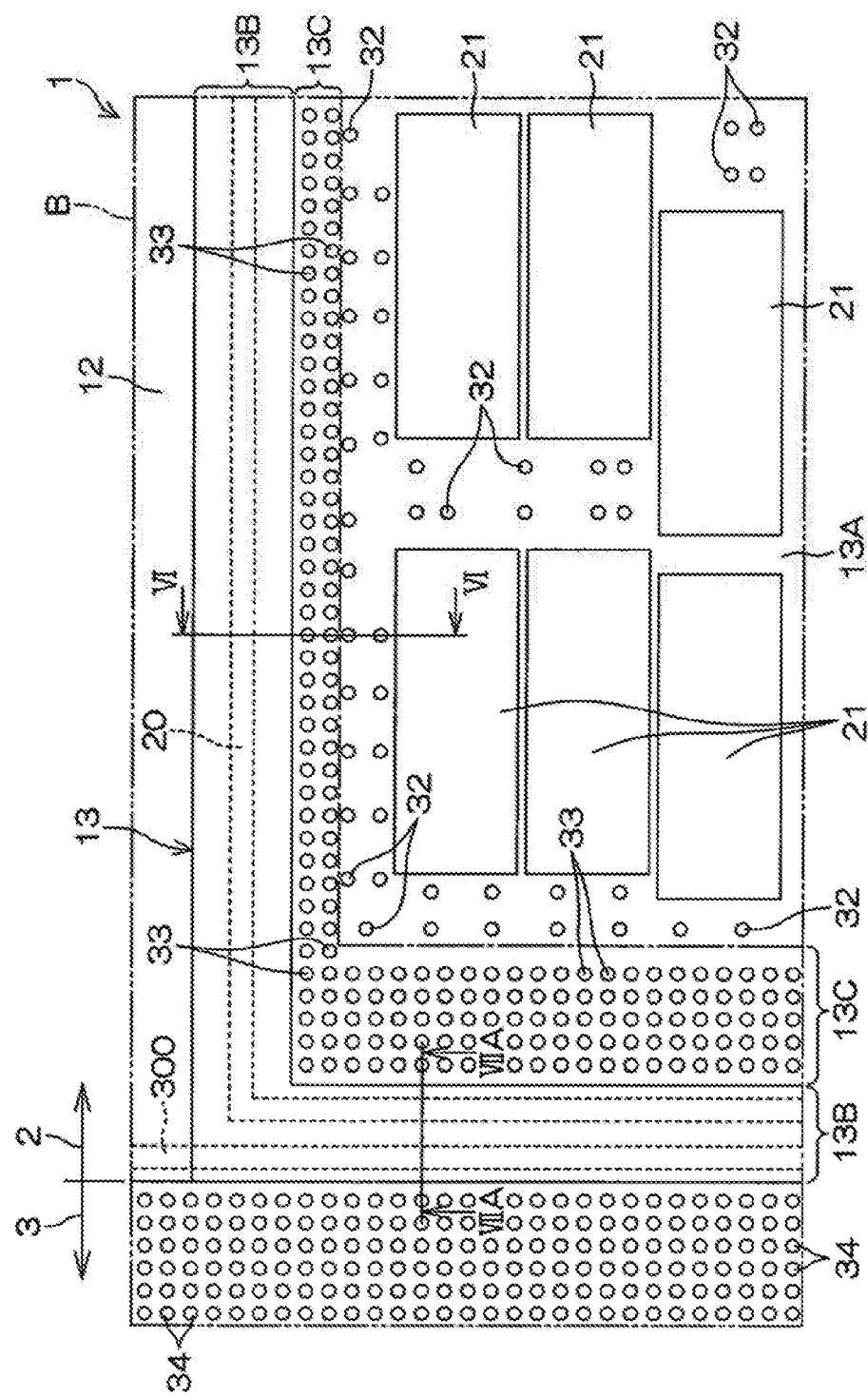
FIG. 5 is an enlarged plan view of part B in FIG. 3.

FIG. 5 is an enlarged plan view of part B in FIG. 3.

A plurality of nonvolatile logic cells 21 are formed in the core region 13A. As viewed from above, A plurality of the nonvolatile logic cells 21 are arranged substantially in a matrix pattern at spaced intervals in both the vertical and horizontal directions. The nonvolatile logic cells 21 each include a flip-flop (not depicted) functioning as the volatile memory section 23, a ferroelectric capacitor 25 (a real ferroelectric capacitor; see FIG. 6) included in the nonvolatile memory section 24, and a MOSFET 26 (see FIG. 6). The ferroelectric capacitor 25 included in the nonvolatile memory section 24 is hereafter referred to as "real capacitor 25."

As viewed from above, a dummy ferroelectric capacitor 31 (see FIG. 6; hereinafter referred to as "first dummy capacitor 31") is formed inside the nonvolatile logic cells 21 in the core region 13A. Further, as viewed from above, a plurality of dummy ferroelectric capacitors 32 (hereinafter referred to as "second dummy capacitors 32") are formed outside the nonvolatile logic cells 21 in the core region 13A. Furthermore, as viewed from above, a plurality of dummy ferroelectric capacitors 33 (hereinafter referred to as "third dummy capacitors 33") are formed in the gap region 13C. As viewed from above, the third dummy capacitors 33 are formed in a grid pattern along the guard ring region 13B.

A plurality of dummy ferroelectric capacitors 34 (hereinafter referred to as "fourth dummy capacitors 34") are formed in the whole scribe region 3 of the semiconductor wafer 1. As viewed from above, the fourth dummy capacitors 34 are formed in a grid pattern along the sides of the functional element regions 2. The first to fourth dummy capacitors 31 to 34 are disposed to decrease the amount of hydrogen entering the real capacitor 25 in a manufacturing process.

Figure 6:
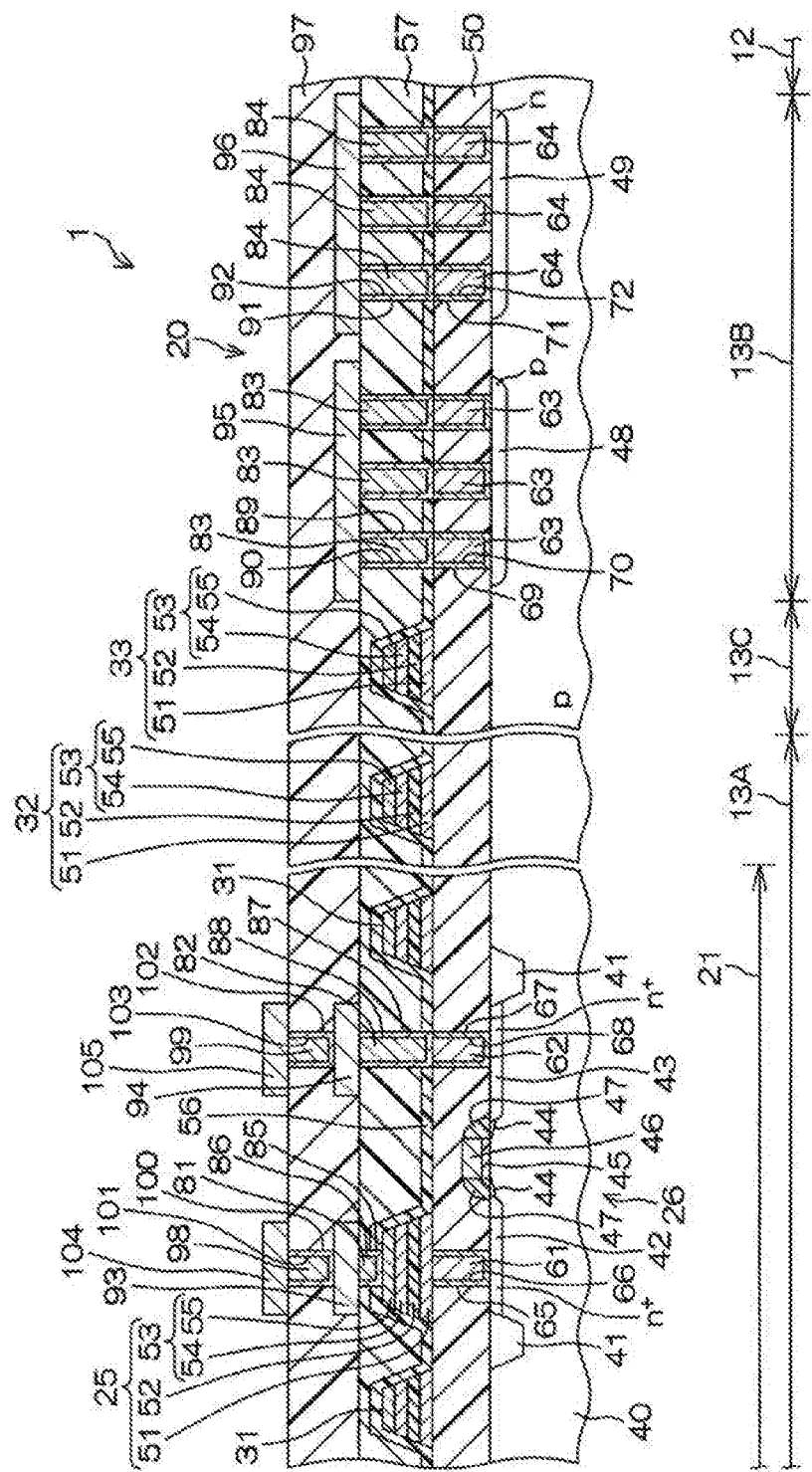
FIG. 6 is a schematic cross-sectional view taken along line VI-VI in FIG. 5.
Figure 7A:
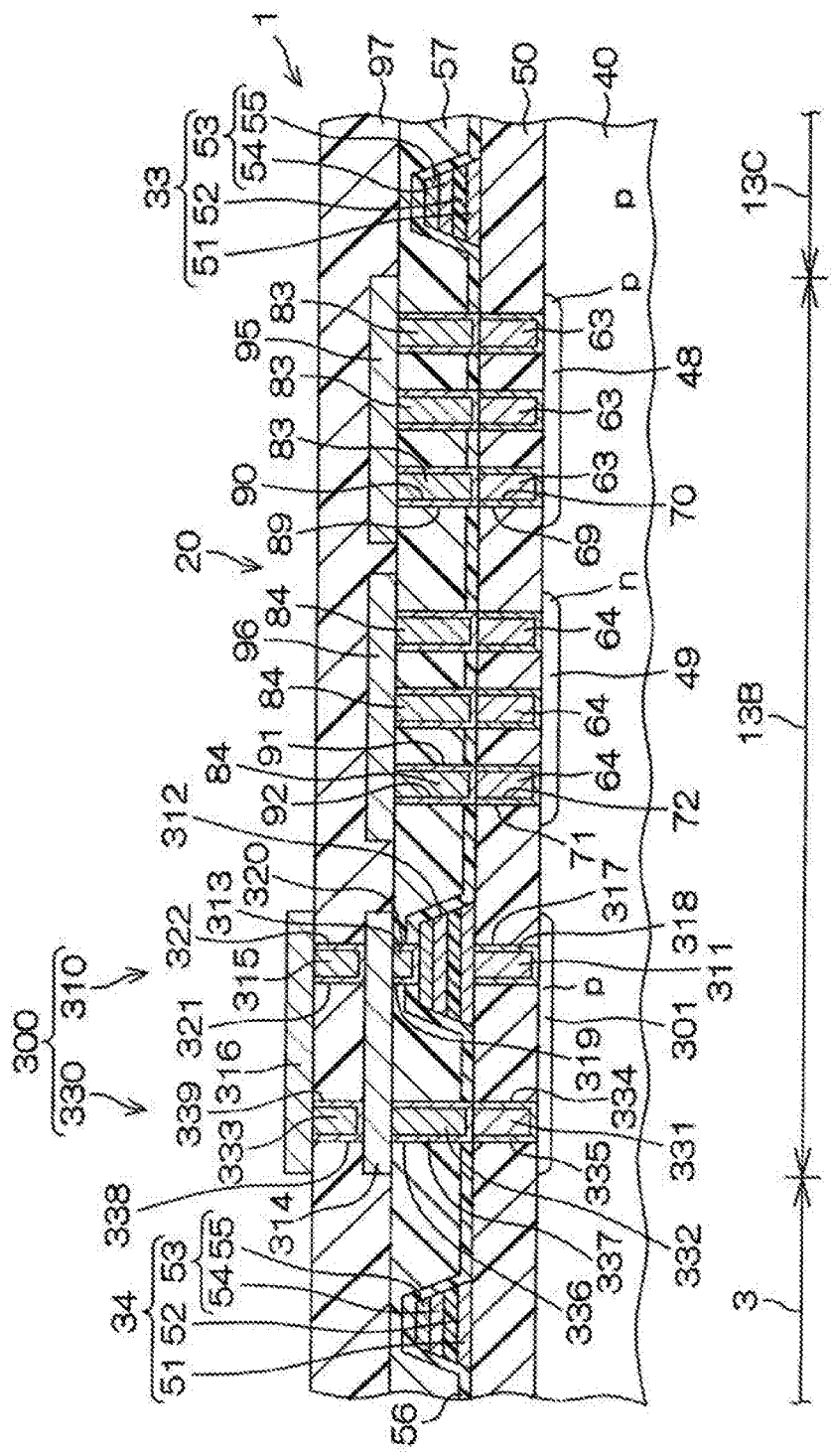
FIG. 7A is a schematic cross-sectional view taken along line VIIA-VIIA in FIG. 5.

As illustrated in FIGS. 6 and 7A, the guard ring 20 includes a ground line 95, plugs 83 and 63, a power supply line 96, and plugs 84 and 64. The ground line 95 is shaped like a rectangular ring as viewed from above. The plugs 83 and 63 are electrically connected to the ground line 95. The power supply line 96 is disposed so as to surround the ground line 95. The plugs 84 and 64 are electrically connected to the power supply line 96.

Figure 7B:
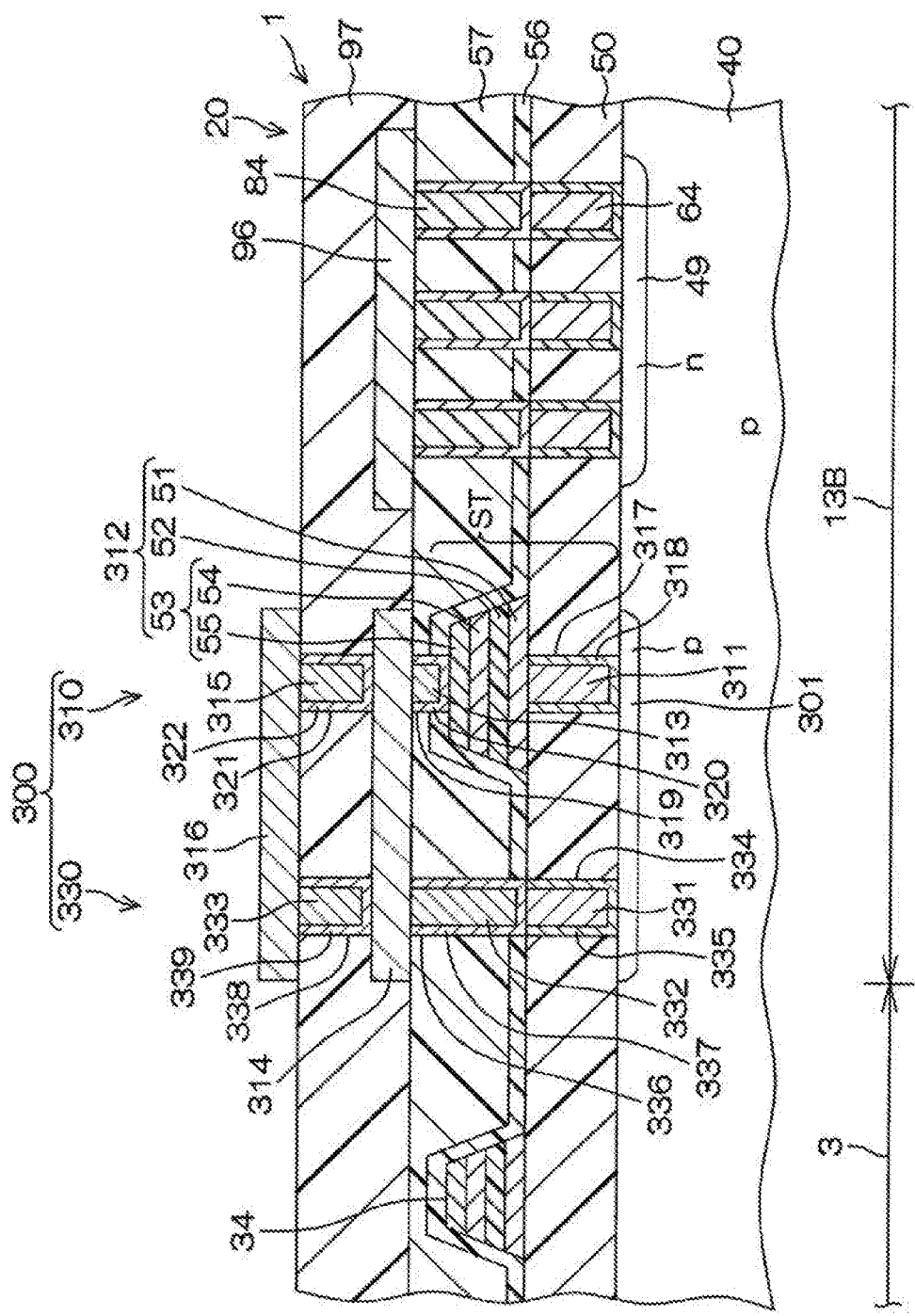
FIG. 7B is a partially enlarged cross-sectional view derived from FIG. 7A and is mainly illustrative of a shield ring.

As illustrated in FIGS. 7A and 7B, the shield ring 300 includes a first shield ring 310 and a second shield ring 330. The first shield ring 310 is shaped like a rectangular ring as viewed from above. The second shield ring 330 is disposed so as to surround the first shield ring 310.

The first shield ring 310 includes a plug 311, a dummy ferroelectric capacitor 312 (hereinafter referred to as "fifth dummy capacitor 312"), a plug 313, a first common shield wiring 314, a plug 315, and a second common shield wiring 316, which are all shaped like a rectangular ring as viewed from above. The fifth dummy capacitor 312 and the plug 311 are disposed to suppress the oxidation of the junction between a bottom electrode 51 and a plug 61 of the real capacitor 25 (see FIG. 6) in the manufacturing process of the semiconductor device 4.

The second shield ring 330 includes plugs 331 and 332, a first common shield wiring 314, a plug 333, and a second common shield wiring 316, which are all shaped like a rectangular ring as viewed from above. The first and second common shield wirings 314 and 316 are shield wirings commonly used for the first shield ring 310 and the second shield ring 330.

FIG. 6 is a schematic cross-sectional view taken along line VI-VI in FIG. 5. More specifically, FIG. 6 is a schematic cross-sectional view illustrating the guard ring region 13B and gap region 13C in the nonvolatile logic region 13 and a region including one nonvolatile logic cell 21. FIG. 7A is a schematic cross-sectional view taken along line VIIA-VIIA in FIG. 5. More specifically, FIG. 7A is a schematic cross-sectional view illustrating an area in the vicinity of the boundary between the nonvolatile logic region 13 and the scribe region 3. FIG. 7B is a partially enlarged cross-sectional view derived from FIG. 7A and is mainly illustrative of a shield ring.

The semiconductor wafer 1 includes a semiconductor substrate 40. The semiconductor substrate 40 in the present embodiment is a p-type Si (silicon) substrate. The MOSFET 26 is formed on the semiconductor substrate 40. An active region electrically element-isolated by an element isolation region 41 is formed on a surface layer of the semiconductor substrate 40. An n+-type drain region 42 and an n+-type source region 43 are disposed in the active region. An n--type high-resistance region 44 is disposed in mutually opposing marginal regions within the drain region 42 and the source region 43.

A gate insulating film 45 is disposed on the semiconductor substrate 40 in opposition to a channel region between the drain region 42 and the source region 43. The gate insulating film 45 is formed, for example, of SiO2. A gate electrode 46 is disposed on the gate insulating film 45. The gate electrode 46 is formed, for example, of polysilicon into which an n-type impurity is doped at a high concentration. A sidewall 47 is disposed around the gate electrode 46. The sidewall 47 covers the whole lateral surface of the gate insulating film 45 and gate electrode 46. The sidewall 47 is formed, for example, of SiN or SiO2. Although not depicted in FIG. 6, a functional element forming a flip-flop functioning as the volatile memory section 23 is formed in the core region 13A of the semiconductor substrate 40.

In a region where the guard ring 20 within the guard ring region 13B should be disposed, a p-type diffusion region 48 and an n-type diffusion region 49 are formed on the surface layer of the semiconductor substrate 40. The p-type diffusion region 48 is shaped like a rectangular ring as viewed from above and formed so as to surround the gap region 13C. The n-type diffusion region 49 is shaped like a rectangular ring as viewed from above and formed so as to surround the p-type diffusion region 48.

A p-type diffusion region 301 (see FIGS. 7A and 7B) shaped like a rectangular ring as viewed from above is formed on the periphery of the functional element region 2 (including a region along the scribe region 3 in the guard ring region 13B) of the surface layer of the semiconductor substrate 40. In the region along the scribe region 3 in the guard ring region 13B, the p-type diffusion region 301 is disposed outside the n-type diffusion region 49 (disposed on a side of the scribe region 3).

A first interlayer insulating film 50 is formed on the semiconductor substrate 40. The first interlayer insulating film 50 is formed, for example, of SiO2.

The real capacitor 25 is formed on the first interlayer insulating film 50 in such a manner that at least a part of the real capacitor 25 is positioned to overlap with the drain region 42 or the source region 43 (the drain region 42 in the present embodiment) as viewed from above. The real capacitor 25 is structured such that the bottom electrode 51, a ferroelectric film 52, and a top electrode 53 are layered over the first interlayer insulating film 50 in the order named. Stated differently, the real capacitor 25 has a layered structure such that the ferroelectric film 52 is positioned between the bottom electrode 51 and the top electrode 53, which opposes the bottom electrode 51. In the present embodiment, the real capacitor 25 is circular (or square) in shape as viewed from above and trapezoidal in shape (shaped like a mesa) as viewed cross-sectionally.

The bottom electrode 51 is formed of a conductive material containing a noble metal such as Ir. In the present embodiment, the bottom electrode 51 is formed of a layered film that includes an IrTa film formed on the drain region 42 and an Ir film formed on the IrTa film. The ferroelectric film 52 is formed of PZT. The top electrode 53 includes a lower electrode layer 54 and an upper electrode layer 55. The lower electrode layer 54 is formed of a conductive material containing Ir. The upper electrode layer 55 is formed of TiN that is layered over the lower electrode layer 54. More specifically, the lower electrode layer 54 is structured such that an Ir film, an IrO2 (iridium dioxide) film, and an Ir film are layered over the ferroelectric film 52 in the order named. The Ir film has hydrogen barrier properties.

A first dummy capacitor 31 is formed on the first interlayer insulating film 50 and positioned in a nonvolatile logic cell 21. A second dummy capacitor 32 is formed on the first interlayer insulating film 50 and positioned outside a nonvolatile logic cell 21 in the core region 13A. A third dummy capacitor 33 is formed on the first interlayer insulating film 50 and positioned in the gap region 13C.

Referring to FIGS. 7A and 7B, a fourth dummy capacitor 34 is formed on the first interlayer insulating film 50 and positioned in the scribe region 3. A fifth dummy capacitor 312 is formed on the first interlayer insulating film 50 and positioned in the guard ring region 13B (precisely, on the periphery of the functional element region 2). The first to fifth dummy capacitors 31, 32, 33, 34 and 312 have the same layer structure as the real capacitor 25. More specifically, these dummy capacitors 31, 32, 33, 34 and 312 are structured such that the bottom electrode 51, the ferroelectric film 52, and the top electrode 53 are layered over the first interlayer insulating film 50 in the order named.

As is the case with the real capacitor 25, the first to fourth dummy capacitors 31, 32, 33 and 34 are circular (or square) in shape as viewed from above and trapezoidal in shape (shaped like a mesa) as viewed cross-sectionally. The bottom electrode 51 and top electrode 53 of the first to fourth dummy capacitors 31, 32, 33 and 34 are not electrically connected to a wiring member such as a contact plug, a via flag, or a wiring. In other words, the first to fourth dummy capacitors 31, 32, 33 and 34 are electrically insulated capacitors.

Meanwhile, the fifth dummy capacitor 312 is formed along the outer periphery of the functional element region 2, shaped like a rectangular ring as viewed from above, and shaped like a trapezoid (like a mesa) as viewed cross-sectionally. The bottom electrode 51 of the fifth dummy capacitor 312 is electrically connected to the semiconductor substrate 40 through the plug 311. Further, the fifth dummy capacitor 312 in the present embodiment is used as a part of a shield ring. Therefore, the top electrode 53 of the fifth dummy capacitor 312 is connected to the second common shield wiring 316 through the plug 313, the first common shield wiring 314, and the plug 315.

The first and second common shield wirings 314 and 316 in the present embodiment are connected to a GND (semiconductor substrate 40). Therefore, the fifth dummy capacitor 312 in the present embodiment is electrically connected to the semiconductor substrate 40, but electrically insulated from a power source.

The surfaces of the real capacitor 25, dummy capacitors 31, 32, 33, 34 and 312, and first interlayer insulating film 50 are covered with a hydrogen barrier film 56 for preventing characteristics deterioration due to hydrogen reduction of the ferroelectric film 52. The hydrogen barrier film 56 is formed, for example, of Al2O3. A second interlayer insulating film 57 is layered over the hydrogen barrier film 56. The second interlayer insulating film 57 is formed, for example, of SiO2.

Within the core region 13A, a first contact plug 61 and a second contact plug 62 are embedded in the first interlayer insulating film 50. The first contact plug 61 is electrically connected to the drain region 42 and to the bottom electrode 51 of the real capacitor 25. The second contact plug 62 is electrically connected to a source region 6.

A first contact hole 65 is formed between the drain region 42 and the bottom electrode 51 of the real capacitor 25. The first contact hole 65 penetrates the first interlayer insulating film 50. A barrier metal 66 is formed on the lateral surface of the first contact hole 65 and on a portion of the drain region 42 that faces the first contact hole 65. The barrier metal 66 is formed, for example, of TiN. The first contact plug 61 is embedded in the first contact hole 65 through the barrier metal 66. The first contact plug 61 is formed, for example, of W (tungsten).

A second contact hole 67 penetrating the first interlayer insulating film 50 is formed above the source region 43. A barrier metal 68 is formed on the lateral surface of the second contact hole 67 and on a portion of the source region 43 that faces the second contact hole 67. The barrier metal 68 is formed of the same material as the barrier metal 66. The second contact plug 62 is embedded in the second contact hole 67 through the barrier metal 68. The second contact plug 62 is formed of the same material as the first contact plug 61.

Within the guard ring region 13B, a plurality of third contact plugs 63 and a plurality of fourth contact plugs 64 are embedded in the first interlayer insulating film 50. The third contact plugs 63 are electrically connected to the p-type diffusion region 48. The fourth contact plugs 64 are electrically connected to the n-type diffusion region 49. A plurality of the third contact plugs 63 are disposed at spaced intervals in both the width direction and length (circumferential) direction of the p-type diffusion region 48, which is shaped like a rectangular ring as viewed from above. Similarly, a plurality of fourth contact plugs 64 are disposed at spaced intervals in both the width direction and length (circumferential) direction of the n-type diffusion region 49, which is shaped like a rectangular ring as viewed from above.

A plurality of third contact holes 69 penetrating the first interlayer insulating film 50 are formed above the p-type diffusion region 48. A barrier metal 70 is formed on the lateral surface of the third contact holes 69 and on a portion of the p-type diffusion region 48 that faces the third contact holes 69. The barrier metal 70 is formed of the same material as the barrier metal 66. The third contact plugs 63 are embedded in the third contact holes 69 through the barrier metal 70. The third contact plugs 63 are formed of the same material as the first contact plug 61.

A plurality of fourth contact holes 71 penetrating the first interlayer insulating film 50 are formed above the n-type diffusion region 49. A barrier metal 72 is formed on the lateral surface of the fourth contact holes 71 and on a portion of the n-type diffusion region 49 that faces the fourth contact holes 71. The barrier metal 72 is formed of the same material as the barrier metal 66. The fourth contact plugs 64 are embedded in the fourth contact holes 71 through the barrier metal 72. The fourth contact plugs 64 are formed of the same material as the first contact plug 61.

Within the guard ring region 13B (precisely, on the periphery of the functional element region 2), a fifth contact plug 311 and a sixth contact plug 331 are embedded in the first interlayer insulating film 50. The fifth contact plug 311 is shaped like a rectangular ring as viewed from above and electrically connected to the p-type diffusion region 301 and to the bottom electrode 51 of the fifth dummy capacitor 312. The sixth contact plug 331 is shaped like a rectangular ring as viewed from above and electrically connected to the p-type diffusion region 301. The sixth contact plug 331 is disposed so as to surround the fifth contact plug 311.

A fifth contact hole 317 is formed between the p-type diffusion region 301 and the bottom electrode 51 of the fifth dummy capacitor 312. The fifth contact hole 317 penetrates the first interlayer insulating film 50 and has a rectangular ring shape as viewed from above. A sixth contact hole 334 is formed above the p-type diffusion region 301, which is shaped like a rectangular ring as viewed from above. The sixth contact hole 334 penetrates the first interlayer insulating film 50 so as to surround the fifth contact hole 317. Barrier metals 318 and 335 are formed on the lateral surface of the fifth and sixth contact holes 317 and 334 and on a portion of the p-type diffusion region 301 that faces the fifth and sixth contact holes 317 and 334. The barrier metals 318 and 335 are formed of the same material as the barrier metal 66. The fifth and sixth contact plugs 311 and 331 are embedded in the fifth and sixth contact holes 317 and 334 through the barrier metals 318 and 335. The fifth and sixth contact plugs 311 and 331 are formed of the same material as the first contact plug 61.

Within the core region 13A, a first via plug 81 and a second via plug 82 are embedded in the second interlayer insulating film 57. The first via plug 81 is electrically connected to the top electrode 53 of the real capacitor 25. The second via plug 82 is electrically connected to the second contact plug 62.

More specifically, a first via hole 85 is formed above the top electrode 53 of the real capacitor 25. The first via hole 85 penetrates the second interlayer insulating film 57, further penetrates the hydrogen barrier film 56, and reaches the middle of the upper electrode layer 55 of the top electrode 53 of the real capacitor 25. A barrier metal 86 is formed on the lateral surface of the first via hole 85 and on a portion of the upper electrode layer 55 that faces the first via hole 85.

The barrier metal 86 is formed, for example, of TiN. The first via plug 81 is embedded in the first via hole 85 through the barrier metal 86. The first via plug 81 is formed, for example, of W (tungsten).

A second via hole 87 is formed above the second contact plug 62. The second via hole 87 penetrates the second interlayer insulating film 57, further penetrates the hydrogen barrier film 56, and reaches the second contact plug 62. A barrier metal 88 is formed on the lateral surface of the second via hole 87 and on a portion of the second contact plug 62 that faces the second via hole 87. The barrier metal 88 is formed of the same material as the barrier metal 86. The second via plug 82 is embedded in the second via hole 87 through the barrier metal 88. The second via plug 82 is formed of the same material as the first via plug 81.

Within the guard ring region 13B, a third via plug 83 and a fourth via plug 84 are embedded in the second interlayer insulating film 57. The third via plug 83 is electrically connected to a third contact plug 63. The fourth via plug 84 is electrically connected to a fourth contact plug 64.

More specifically, a third via hole 89 is formed above the third contact plug 63. The third via hole 89 penetrates the second interlayer insulating film 57, further penetrates the hydrogen barrier film 56, and reaches the third contact plug 63. A barrier metal 90 is formed on the lateral surface of the third via hole 89 and on a portion of the third contact plug 63 that faces the third via hole 89. The barrier metal 90 is formed of the same material as the barrier metal 86. The third via plug 83 is embedded in the third via hole 89 through the barrier metal 90. The third via plug 83 is formed of the same material as the first via plug 81.

A fourth via hole 91 is formed above the fourth contact plug 64. The fourth via hole 91 penetrates the second interlayer insulating film 57, further penetrates the hydrogen barrier film 56, and reaches the fourth contact plug 64. A barrier metal 92 is formed on the lateral surface of the fourth via hole 91 and on a portion of the fourth contact plug 64 that faces the fourth via hole 91. The barrier metal 92 is formed of the same material as the barrier metal 86. The fourth via plug 84 is embedded in the fourth via hole 91 through the barrier metal 92. The fourth via plug 84 is formed of the same material as the first via plug 81.

Within the guard ring region 13B (precisely, on the periphery of the functional element region 2), a seventh via plug 313 and an eighth via plug 332 are embedded in the second interlayer insulating film 57. The seventh via plug 313 is electrically connected to the top electrode 53 of the fifth dummy capacitor 312. The eighth via plug 332 is electrically connected to the sixth contact plug 331.

More specifically, a seventh via hole 319 is formed above the top electrode 53 of the fifth dummy capacitor 312. The seventh via hole 319 penetrates the second interlayer insulating film 57, further penetrates the hydrogen barrier film 56, and reaches the middle of the upper electrode layer 55 of the top electrode 53 of the fifth dummy capacitor 312. A barrier metal 320 is formed on the lateral surface of the seventh via hole 319 and on a portion of the upper electrode layer 55 that faces the seventh via hole 319. The barrier metal 320 is formed of the same material as the barrier metal 86. The seventh via plug 313 is embedded in the seventh via hole 319 through the barrier metal 320. The seventh via plug 313 is formed of the same material as the first via plug 81.

An eighth via hole 336 is formed above the sixth contact plug 331. The eighth via hole 336 penetrates the second interlayer insulating film 57, further penetrates the hydrogen barrier film 56, and reaches the sixth contact plug 331. A barrier metal 337 is formed on the lateral surface of the eighth via hole 336 and on a portion of the sixth contact plug 331 that faces the eighth via hole 336. The barrier metal 337 is formed of the same material as the barrier metal 86. The eighth via plug 332 is embedded in the eighth via hole 336 through the barrier metal 337. The eighth via plug 332 is formed of the same material as the first via plug 81.

Within the core region 13A, a first wiring 93 and a second wiring 94 are formed on the second interlayer insulating film 57. The first wiring 93 is electrically connected to the first via plug 81. The second wiring 94 is electrically connected to the second via plug 82.

Within the guard ring region 13B, the ground line 95 and the power supply line 96 are formed on the second interlayer insulating film 57. The ground line 95 is shaped like a rectangular ring as viewed from above and electrically connected to the third via plug 83. The power supply line 96 is shaped like a rectangular ring as viewed from above and electrically connected to the fourth via plug 84.

Within the guard ring region 13B (precisely, on the periphery of the functional element region 2), the first common shield wiring 314 is formed on the second interlayer insulating film 57. The first common shield wiring 314 is shaped like a rectangular ring as viewed from above and electrically connected to the seventh via plug 313 and the eighth via plug 332.

A third interlayer insulating film 97 is formed on the second interlayer insulating film 57 to cover the wirings 93 and 94, the ground line 95, the power supply line 96, and the shield wiring 314. The third interlayer insulating film 97 is formed, for example, of SiO2.

Within the core region 13A, a fifth via plug 98 and a sixth via plug 99 are embedded in the third interlayer insulating film 97. The fifth via plug 98 is electrically connected to the first wiring 93. The sixth via plug 99 is electrically connected to the second wiring 94.

More specifically, a fifth via hole 100 is formed above the first wiring 93. The fifth via hole 100 penetrates the third interlayer insulating film 97 and reaches the first wiring 93. A barrier metal 101 is formed on the lateral surface of the fifth via hole 100 and on a portion of the first wiring 93 that faces the fifth via hole 100. The barrier metal 101 is formed, for example, of TiN. The fifth via plug 98 is embedded in the fifth via hole 100 through the barrier metal 101. The fifth via plug 98 is formed, for example, of W (tungsten).

A sixth via hole 102 is formed above the second wiring 94. The sixth via hole 102 penetrates the third interlayer insulating film 97 and reaches the second wiring 94. A barrier metal 103 is formed on the lateral surface of the sixth via hole 102 and on a portion of the second wiring 94 that faces the sixth via hole 102. The barrier metal 103 is formed of the same material as the barrier metal 101. The sixth via plug 99 is embedded in the sixth via hole 102 through the barrier metal 103. The sixth via plug 99 is formed of the same material as the fifth via plug 98.

Within the guard ring region 13B (precisely, on the periphery of the functional element region 2), a ninth via plug 315 and a tenth via plug 333 are embedded in the third interlayer insulating film 97. The ninth via plug 315 and the tenth via plug 333 are shaped like a rectangular ring as viewed from above and electrically connected to the first common shield wiring 314. The ninth via plug 315, which is shaped like a rectangular ring as viewed from above, is disposed above the seventh via plug 313, which is shaped like a rectangular ring as viewed from above. The tenth via plug 333, which is shaped like a rectangular ring as viewed from above, is disposed above the eighth via plug 332, which is shaped like a rectangular ring as viewed from above. The tenth via plug 333 is disposed so as to surround the ninth via plug 315.

More specifically, a ninth via hole 321 and a tenth via hole 338 are formed above the first common shield wiring 314. The ninth via hole 321 is shaped like a rectangular ring as viewed from above and positioned so as to oppose the seventh via plug 313. The tenth via hole 338 is shaped like a rectangular ring as viewed from above and positioned so as to oppose the eighth via plug 332. The ninth via hole 321 and the tenth via hole 338 penetrate the third interlayer insulating film 97 and reach the first common shield wiring 314.

Barrier metals 322 and 339 are respectively formed on the lateral surfaces of the ninth via hole 321 and tenth via hole 338 and on portions of the first common shield wiring 314 that faces the ninth via hole 321 and the tenth via hole 338. The barrier metals 322 and 339 are formed, for example, of TiN. The ninth via plug 315 and the tenth via plug 333 are respectively embedded in the ninth via hole 321 and the tenth via hole 338 through the barrier metals 322 and 339. The ninth via plug 315 and the tenth via plug 333 are formed, for example, of W (tungsten).

Within the core region 13A, a third wiring 104 and a fourth wiring 105 are formed on the third interlayer insulating film 97. The third wiring 104 is electrically connected to the fifth via plug 98. The fourth wiring 105 is electrically connected to the sixth via plug 99.

Within the guard ring region 13B (precisely, on the periphery of the functional element region 2), the second common shield wiring 316 is formed on the third interlayer insulating film 97 and electrically connected to the ninth via plug 315 and the tenth via plug 333.

It is preferable that the first to third dummy capacitors 31 to 33 not be formed below a position where a wiring (except the first shield wiring 314) is routed on the second interlayer insulating film 57. The reason is that if the first to third dummy capacitors 31 to 33 are formed at a position below the wiring, a parasitic capacitor might be formed at such a position to delay the transmission of a signal passing through the wiring.

A structure having not only a dummy ferroelectric capacitor that has the same layer structure as the real capacitor 25 and is not used as a nonvolatile memory element, but also a plug for electrically connecting the bottom electrode of the dummy ferroelectric capacitor to the semiconductor substrate 40 will be hereinafter referred to as "real capacitor oxidation suppression structure." The top electrode of the dummy ferroelectric capacitor may be open or connected to a power source or a GND.

In the foregoing embodiment, a structure having the fifth dummy capacitor 312 and the fifth contact plug 311, which electrically connects the bottom electrode 51 of the fifth dummy capacitor 312 to the semiconductor substrate 40, is the real capacitor oxidation suppression structure ST. As described later, in the manufacturing process of the semiconductor device 4, the real capacitor oxidation suppression structure is able to suppress the oxidation of the junction between the first contact plug 61 and the bottom electrode 51 of the real capacitor 25, and decrease the interface resistance between the first contact plug 61 and the bottom electrode 51 of the real capacitor 25.

FIGS. 8A, 8B, 8C, 8D, 8E, 8F, 8G, 8H, 8I, 8J, 8K, 8L, 8M, 8N, 8O, 8P and 8Q are cross-sectional views mainly illustrating exemplary processes of manufacturing a nonvolatile logic cell, a dummy capacitor to be formed around the nonvolatile logic cell, and a guard ring. These cross-sectional views correspond to FIG. 6. FIGS. 9A, 9B, 9C, 9D, 9E, 9F, 9G, 9H, 9I, 9J, 9K, 9L, 9M, 9N, 9O, 9P and 9Q are cross-sectional views mainly illustrating exemplary processes of manufacturing a dummy capacitor, a guard ring, and a shield ring that are to be formed in a scribe region and in a gap region. These cross-sectional views correspond to FIG. 7A.

Figure 8A:
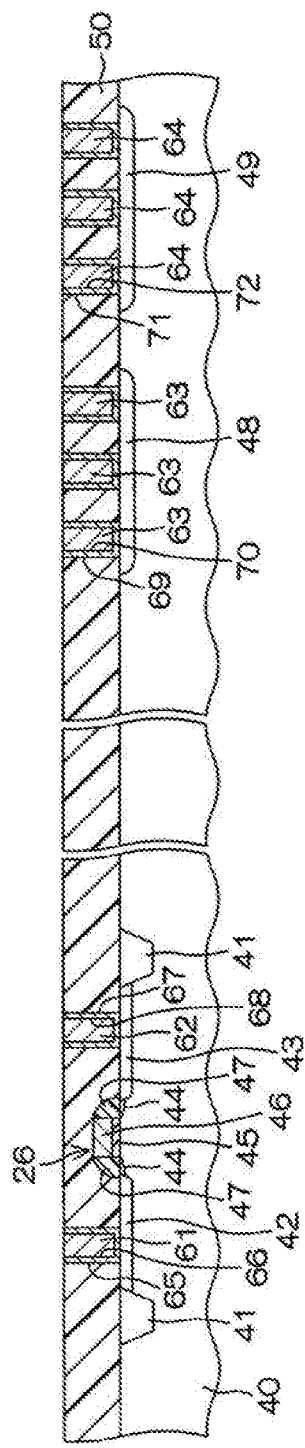
FIG. 8A is a cross-sectional view mainly illustrating an exemplary process of manufacturing a nonvolatile logic cell, a dummy capacitor to be formed around the nonvolatile logic cell, and a guard ring. This cross-sectional view corresponds to FIG. 6.
Figure 9A:
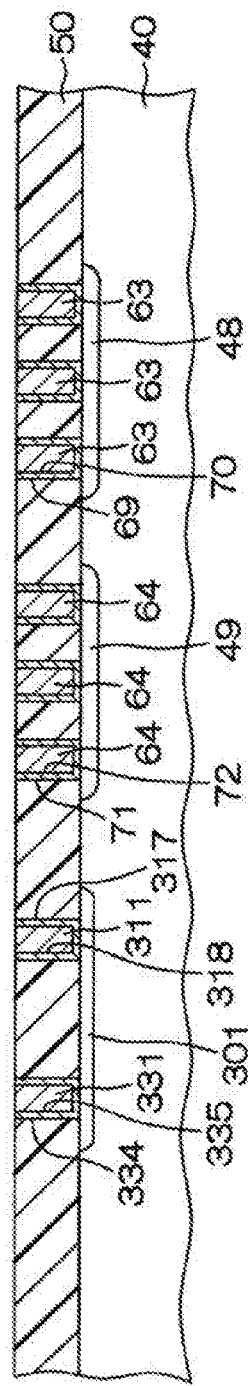
FIG. 9A is a cross-sectional view mainly illustrating an exemplary process of manufacturing a dummy capacitor, a guard ring, and a shield ring that are to be formed in a scribe region and in a gap region. This cross-sectional view corresponds to FIG. 7A.

As illustrated in FIGS. 8A and 9A, a publicly known method is used to form, on the semiconductor substrate 40, functional elements (not depicted) forming the MOSFET 26, the p-type diffusion region 48, the n-type diffusion region 49, the p-type diffusion region 301, and the volatile memory section (flip-flop) 23. The MOSFET 26 includes the element isolation region 41, the drain region 42, the source region 43, the n−-type high-resistance region 44, the gate insulating film 45, the gate electrode 46, and the sidewall 47.

Subsequently, the first interlayer insulating film 50 is formed on the semiconductor substrate 40. Then, the first to sixth contact holes 65, 67, 69, 71, 317 and 334, the barrier metals 66, 68, 70, 72, 318 and 335, and the first to sixth contact plugs 61 to 64, 311 and 331 are formed on the first interlayer insulating film 50.

Figure 8B:
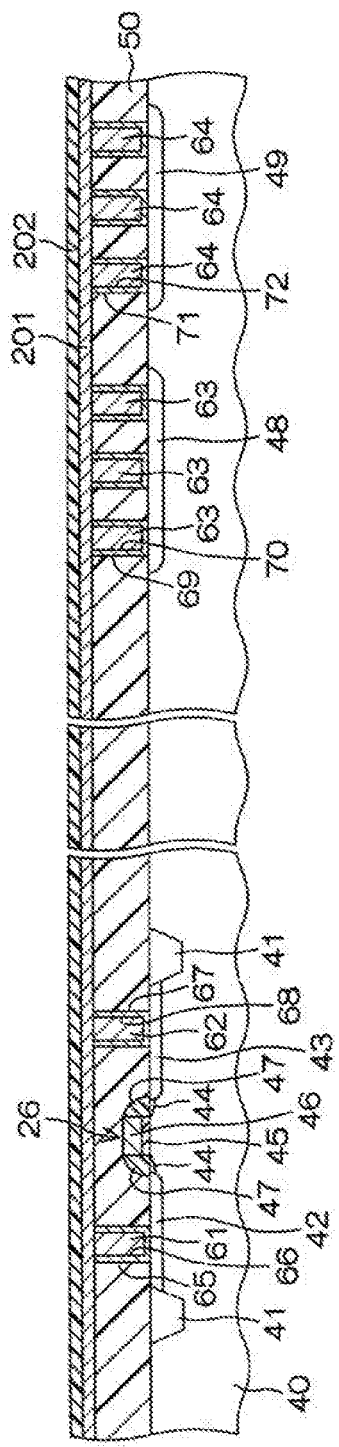
FIG. 8B is a schematic cross-sectional view illustrating a process subsequent to the process illustrated in FIG. 8A.
Figure 9B:
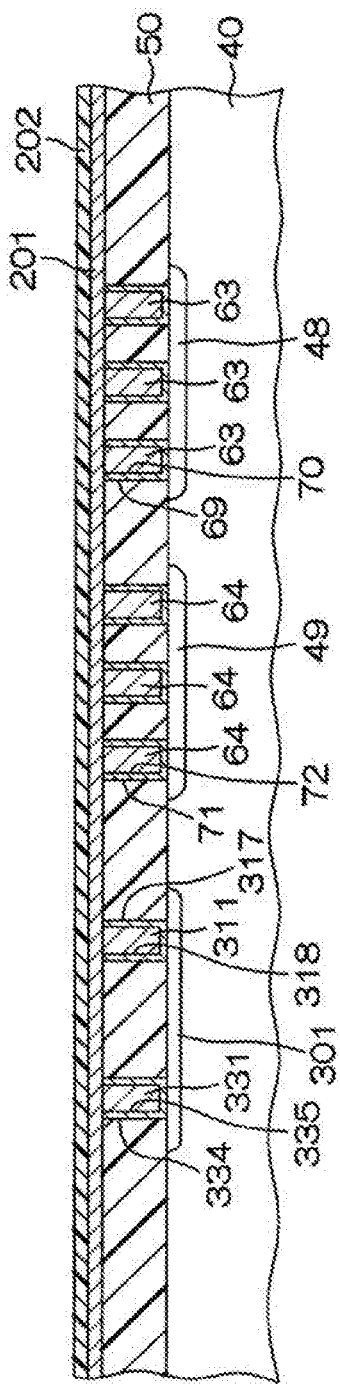
FIG. 9B is a schematic cross-sectional view illustrating a process subsequent to the process illustrated in FIG. 9A.

Subsequently, as illustrated in FIGS. 8B and 9B, the sputtering method is used to form a bottom electrode material film 201 on the first interlayer insulating film 50. The bottom electrode material film 201 is formed of the material of the bottom electrode 51 of the real capacitor 25 and dummy capacitors 31 to 34 and 312. Further, the MOCVD method is used to form a PZT film 202 on the bottom electrode material film 201. The PZT film 202 is formed of PZT, which is the material of the ferroelectric film 52.

Figure 8C:
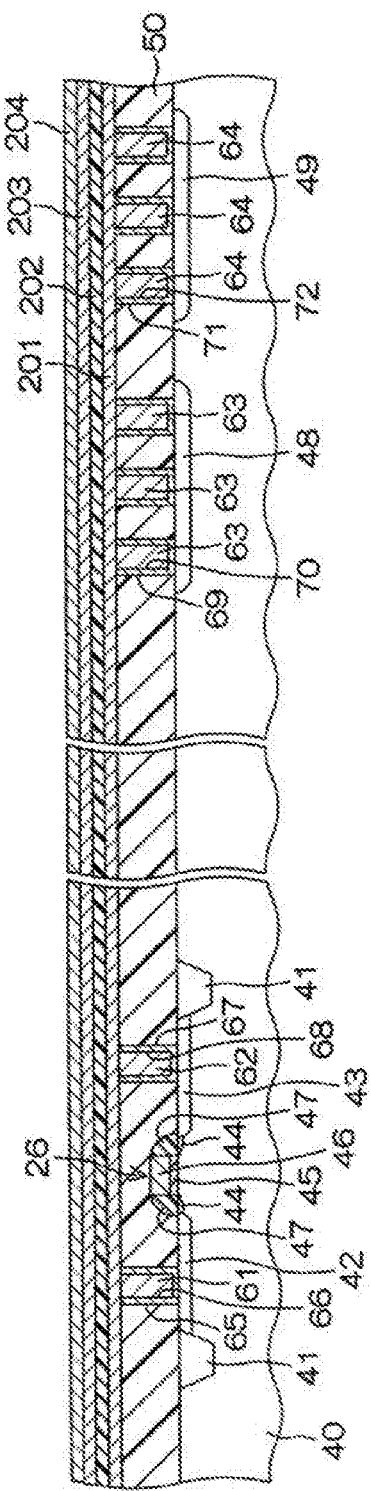
FIG. 8C is a schematic cross-sectional view illustrating a process subsequent to the process illustrated in FIG. 8B.
Figure 9C:
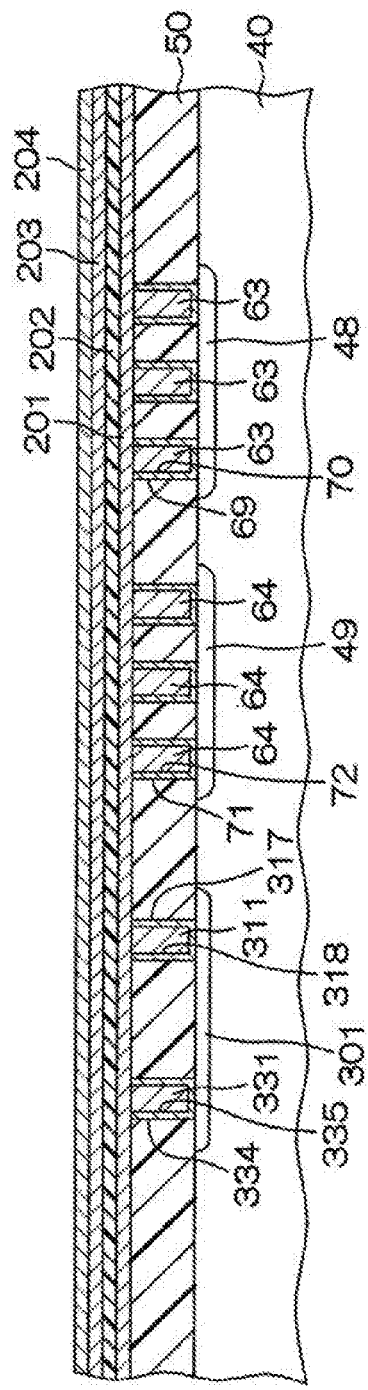
FIG. 9C is a schematic cross-sectional view illustrating a process subsequent to the process illustrated in FIG. 9B.

Next, as illustrated in FIGS. 8C and 9C, the sputtering method is used to form a layered film 203 (Ir film, IrO2 film, and Ir film) on the PZT film 202. The layered film 203 is formed of the material of the lower electrode layer 54 of the top electrode 53. Subsequently, the sputtering method is used to form a TiN film 204 on the layered film 203. The TiN film 204 is formed of TiN, which is the material of the upper electrode layer 55 of the top electrode 53. After the TiN film 204 is formed, for example, the CMP method may be used to flatten the surface of the TiN film 204.

Figure 8D:
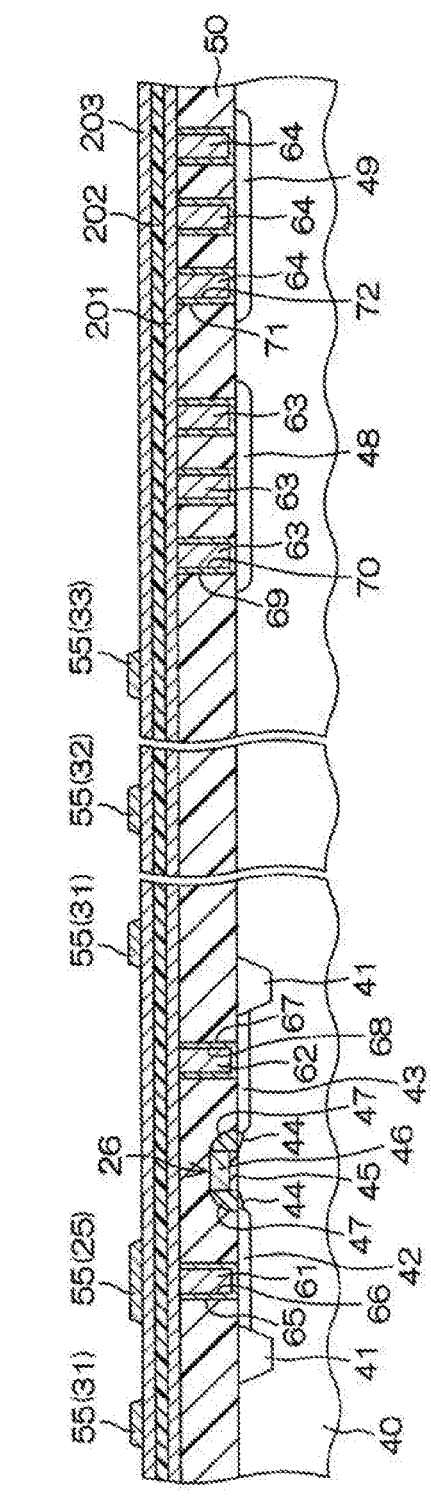
FIG. 8D is a schematic cross-sectional view illustrating a process subsequent to the process illustrated in FIG. 8C.
Figure 9D:
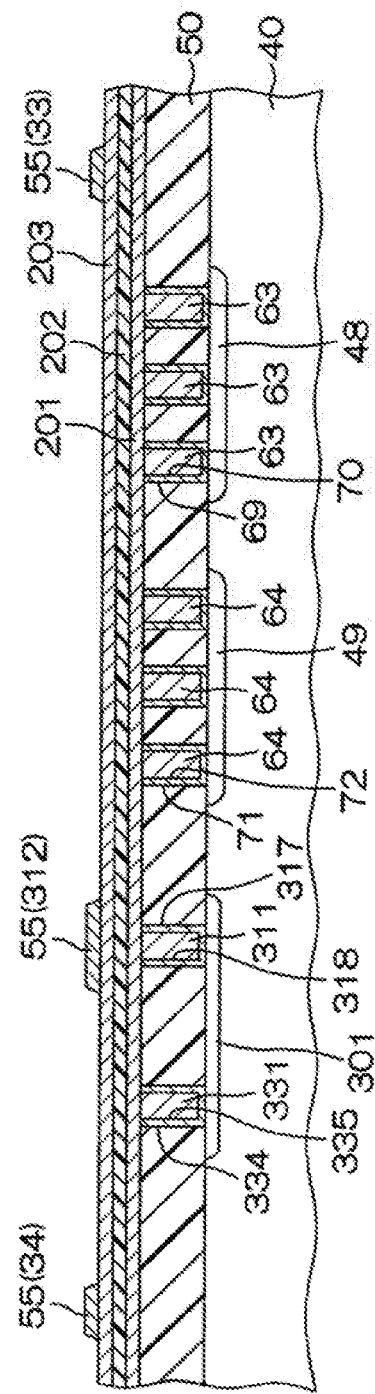
FIG. 9D is a schematic cross-sectional view illustrating a process subsequent to the process illustrated in FIG. 9C.

Subsequently, as illustrated in FIGS. 8D and 9D, a resist mask of a pattern for the upper electrode layer 55 is formed by photolithography. The formed resist mask is then used as a mask to dry-etch the TiN film 204 in order to form the upper electrode layer 55 having a predetermined pattern.

Next, dry etching is performed by using the upper electrode layer 55 as a mask in order to sequentially remove portions of the layered film 203, PZT film 202, and bottom electrode material film 201 that are exposed from the upper electrode layer 55. In this instance, reactive gas (etchant) is changed at an appropriate point of time so as to successively etch the layered film 203, the PZT film 202, and the bottom electrode material film 201.

Figure 8E:
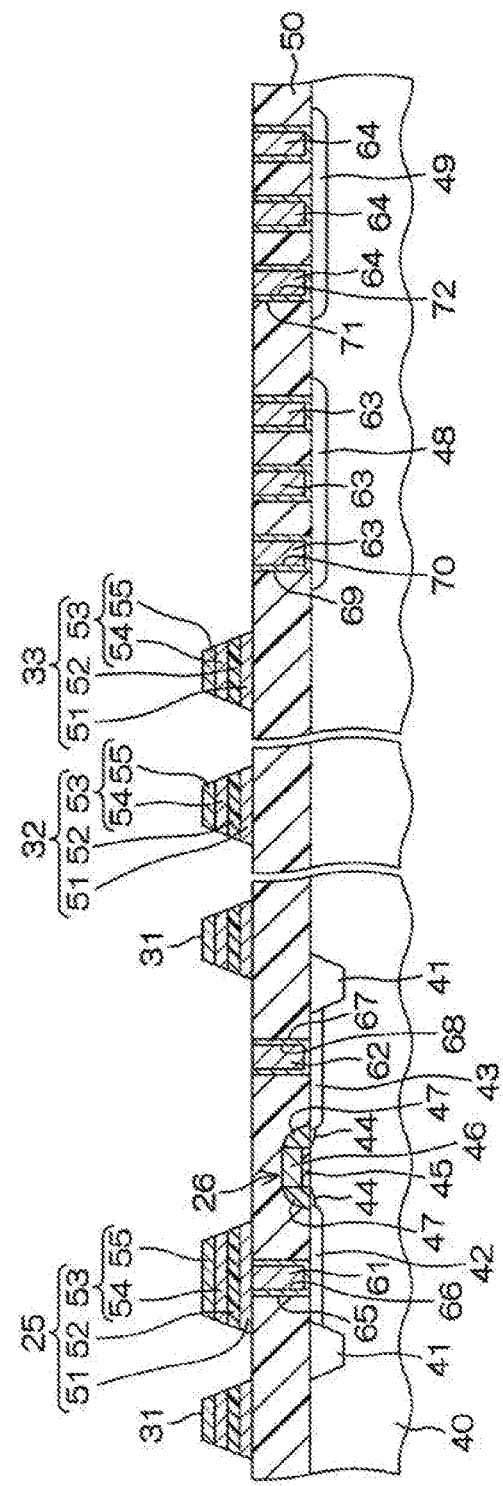
FIG. 8E is a schematic cross-sectional view illustrating a process subsequent to the process illustrated in FIG. 8D.
Figure 9E:
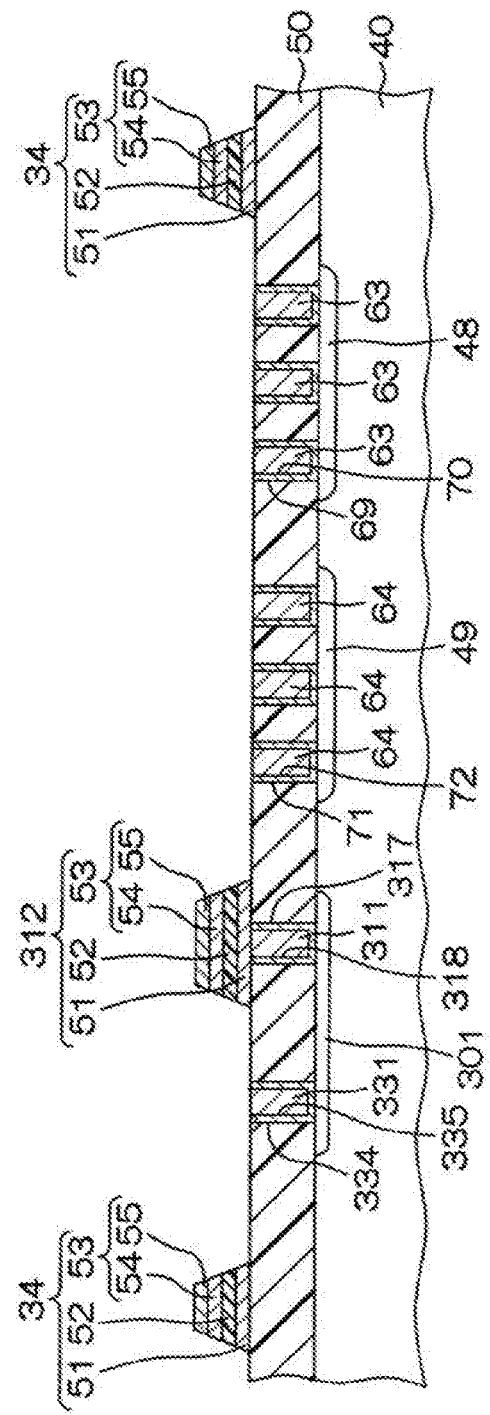
FIG. 9E is a schematic cross-sectional view illustrating a process subsequent to the process illustrated in FIG. 9D.

As a result, as illustrated in FIGS. 8E and 9E, the bottom electrode material film 201, the PZT film 202, and the layered film 203 are patterned on the bottom electrode 51, the ferroelectric film 52, and the lower electrode layer 54, respectively. Accordingly, obtained are the real capacitor 25 and the first to fifth dummy capacitors 31 to 34 and 312, which are formed of the bottom electrode 51, the ferroelectric film 52, the lower electrode layer 54, and the upper electrode layer 55.

Figure 8F:
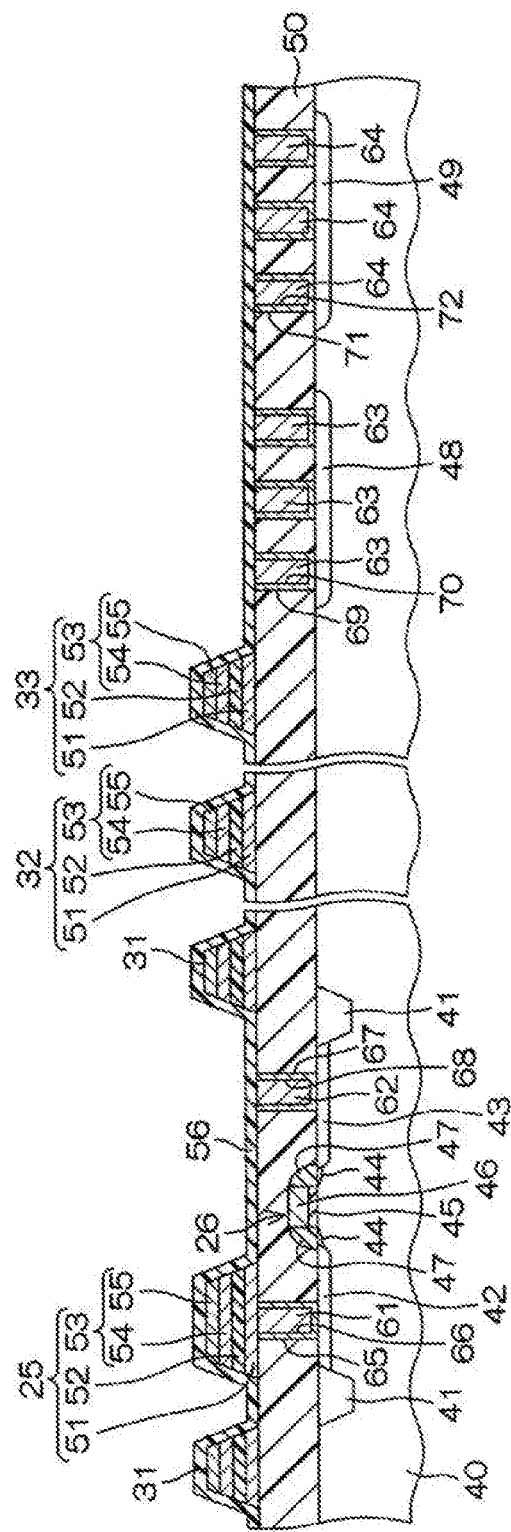
FIG. 8F is a schematic cross-sectional view illustrating a process subsequent to the process illustrated in FIG. 8E.
Figure 9F:
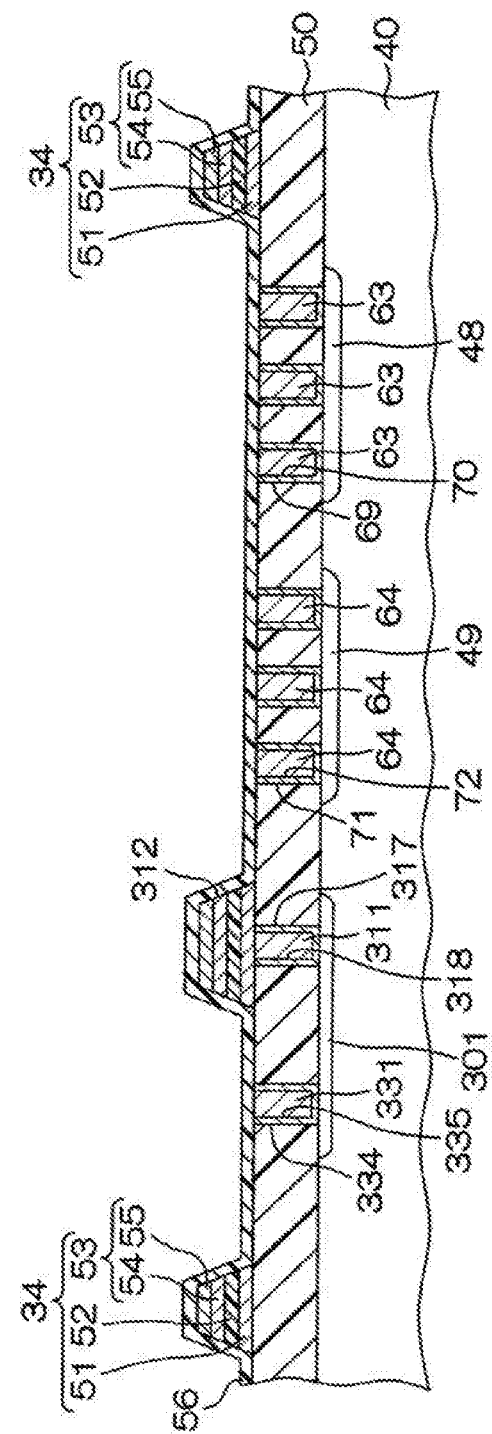
FIG. 9F is a schematic cross-sectional view illustrating a process subsequent to the process illustrated in FIG. 9E.

Subsequently, as illustrated in FIGS. 8F and 9F, the sputtering method is used to form the hydrogen barrier film 56 on the first interlayer insulating film 50, the real capacitor 25, and the dummy capacitors 31 to 34 and 312.

In etching processes for patterning the aforementioned material films 201 to 204 (the processes depicted in FIGS. 8D and 9D and the processes depicted in FIGS. 8E and 9E) and in processes for forming the hydrogen barrier film 56 on the capacitors 25, 31 to 34 and 312, plasma is generated in a chamber. The inventors of the present invention have found that the interface resistance between the first contact plug 61 and the bottom electrode 51 of the real capacitor 25 is increased by the plasma generated in the above-mentioned processes.

More specifically, the bottom electrode material film 201 in a region where the real capacitor 25 is to be formed or the bottom electrode 51 of the real capacitor 25 is electrically connected to the drain region 42 of the semiconductor substrate 40 through the first contact plug 61. Therefore, if plasma is generated in the above-mentioned processes, charged particles (electrons and positive ions) in the plasma pass through a first conductive path that includes the first contact plug 61, the semiconductor substrate 40, and the bottom electrode material film 201 in the region where the real capacitor 25 is to be formed or the bottom electrode 51 of the real capacitor 25. As this causes a large current flow in the first conductive path, the junction between the first contact plug 61 and the bottom electrode 51 of the real capacitor 25 is oxidized to increase the interface resistance between the first contact plug 61 and the bottom electrode 51 of the real capacitor 25. The larger the current flow in the first conductive path, the higher the degree of oxidation.

The present embodiment has the real capacitor oxidation suppression structure ST that includes the fifth dummy capacitor 312 and the fifth contact plug 311. Therefore, when plasma is generated in the above-mentioned processes, the charged particles in the plasma pass through a second conductive path that includes the fifth contact plug 311, the semiconductor substrate 40, and the bottom electrode material film 201 in a region where the fifth dummy capacitor 312 is to be formed or the bottom electrode 51 of the fifth dummy capacitor 312. In other words, a current additionally flows in the second conductive path. Therefore, as compared to a case where the real capacitor oxidation suppression structure ST (fifth dummy capacitor 312) is not formed, the current flow in the first conductive path can be decreased. This makes it possible to suppress the oxidation of the junction between the first contact plug 61 and the bottom electrode 51 of the real capacitor 25. Consequently, the interface resistance between the first contact plug 61 and the bottom electrode 51 of the real capacitor 25 can be decreased.

Figure 8G:
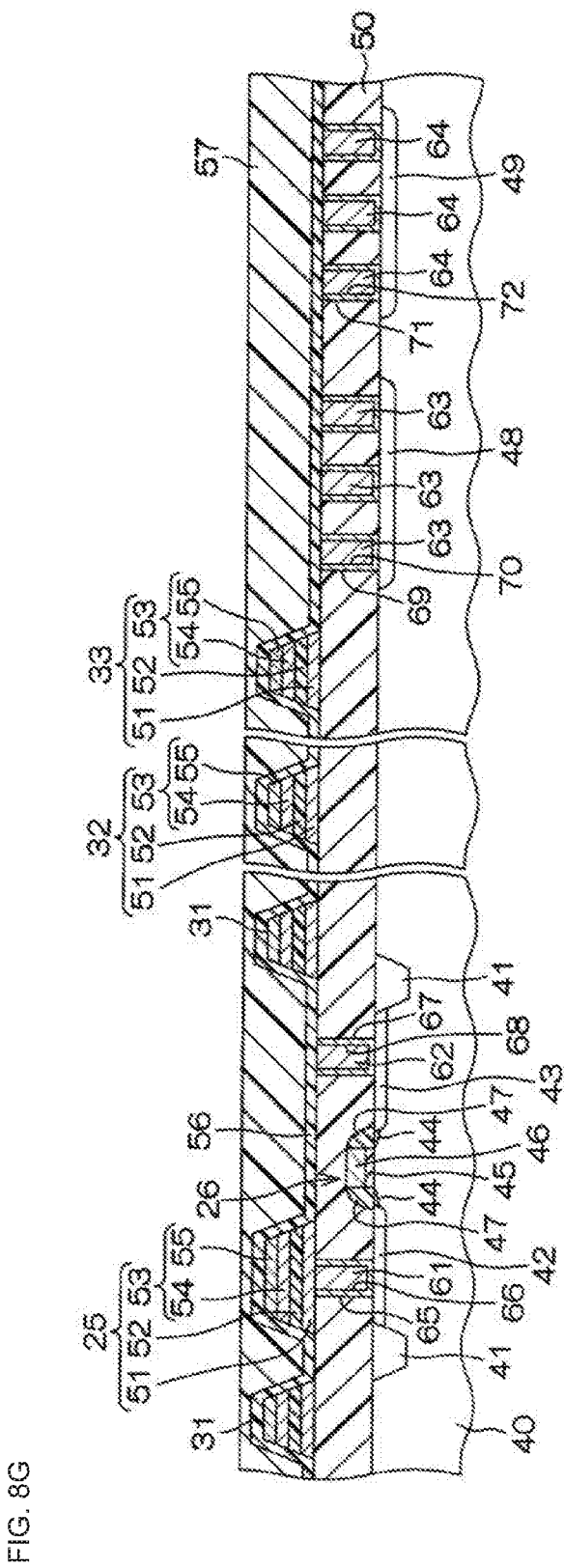
FIG. 8G is a schematic cross-sectional view illustrating a process subsequent to the process illustrated in FIG. 8F.
Figure 9G:
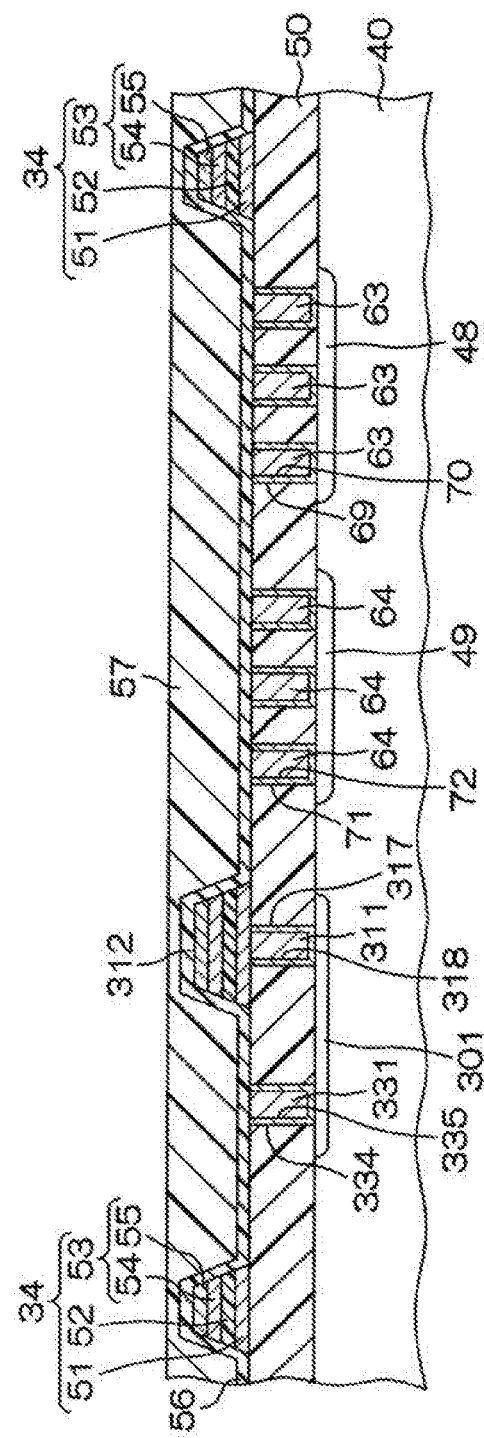
FIG. 9G is a schematic cross-sectional view illustrating a process subsequent to the process illustrated in FIG. 9F.

Next, as illustrated in FIGS. 8G and 9G, the CVD method is used to form the second interlayer insulating film 57 on the hydrogen barrier film 56. As the surfaces of the real capacitor 25 and dummy capacitors 31 to 34 and 312 are covered by the hydrogen barrier film 56, hydrogen reduction of the ferroelectric film 52 can be prevented even when the CVD method based on the use of hydrogen is adopted as the method of forming the second interlayer insulating film 57.

Figure 8H:
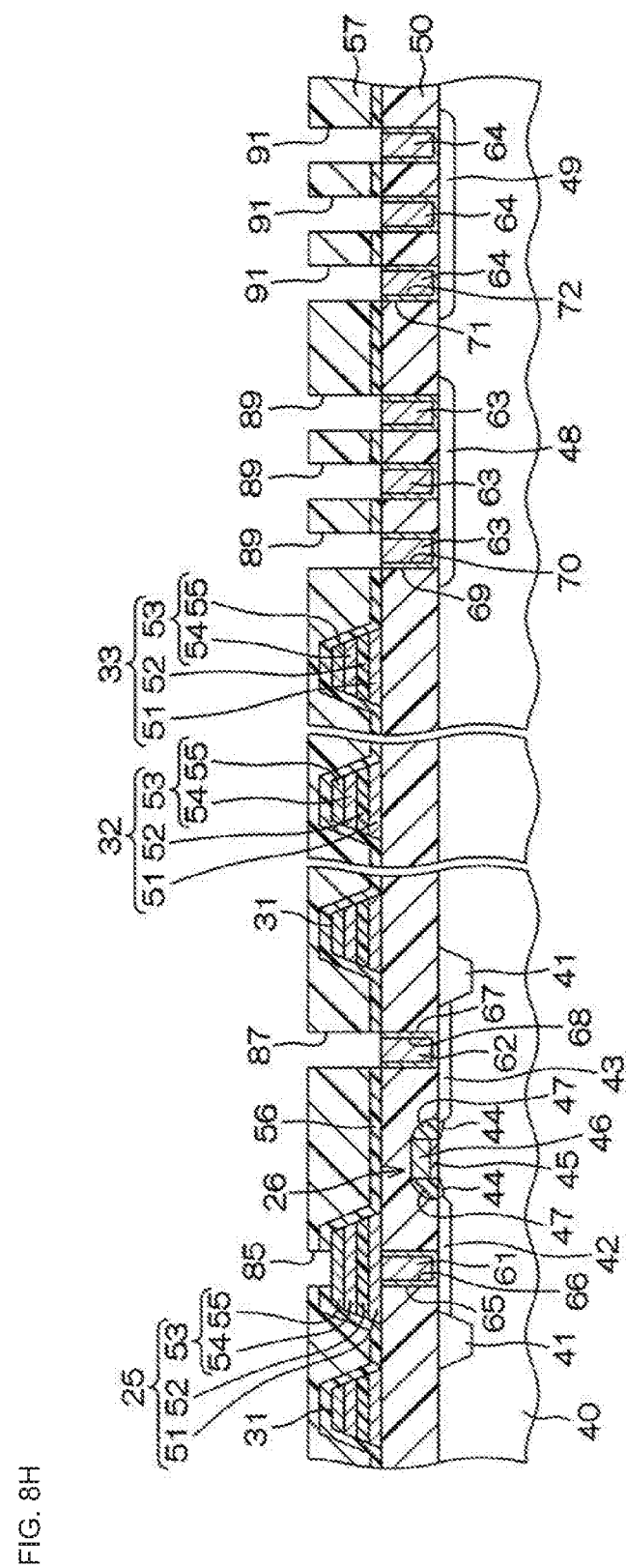
FIG. 8H is a schematic cross-sectional view illustrating a process subsequent to the process illustrated in FIG. 8G.
Figure 9H:
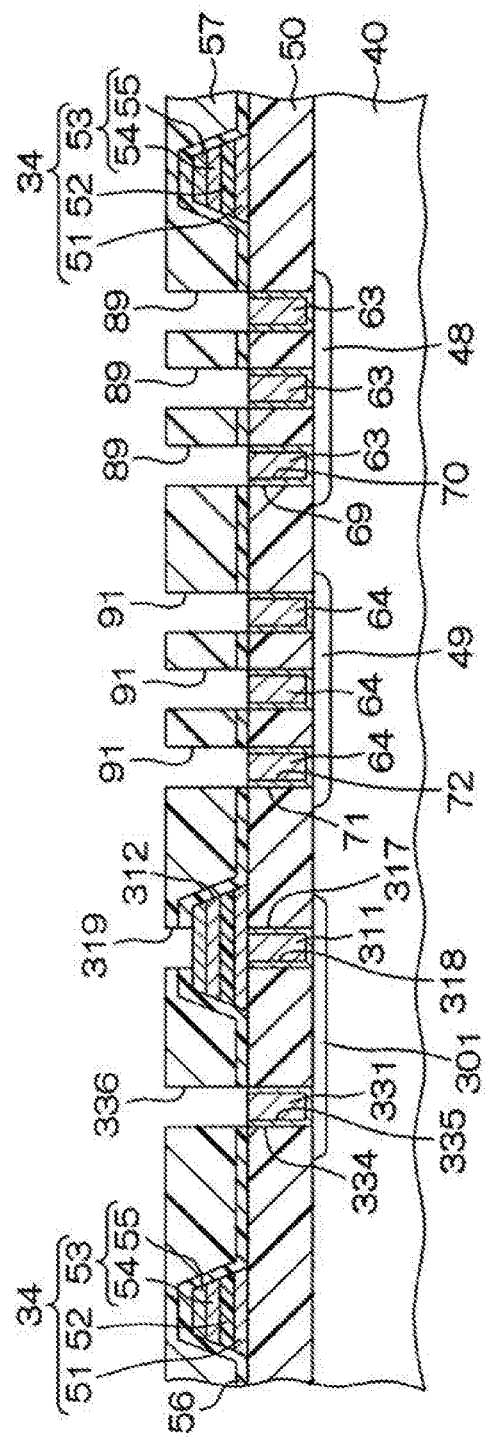
FIG. 9H is a schematic cross-sectional view illustrating a process subsequent to the process illustrated in FIG. 9G.
Figure 91:
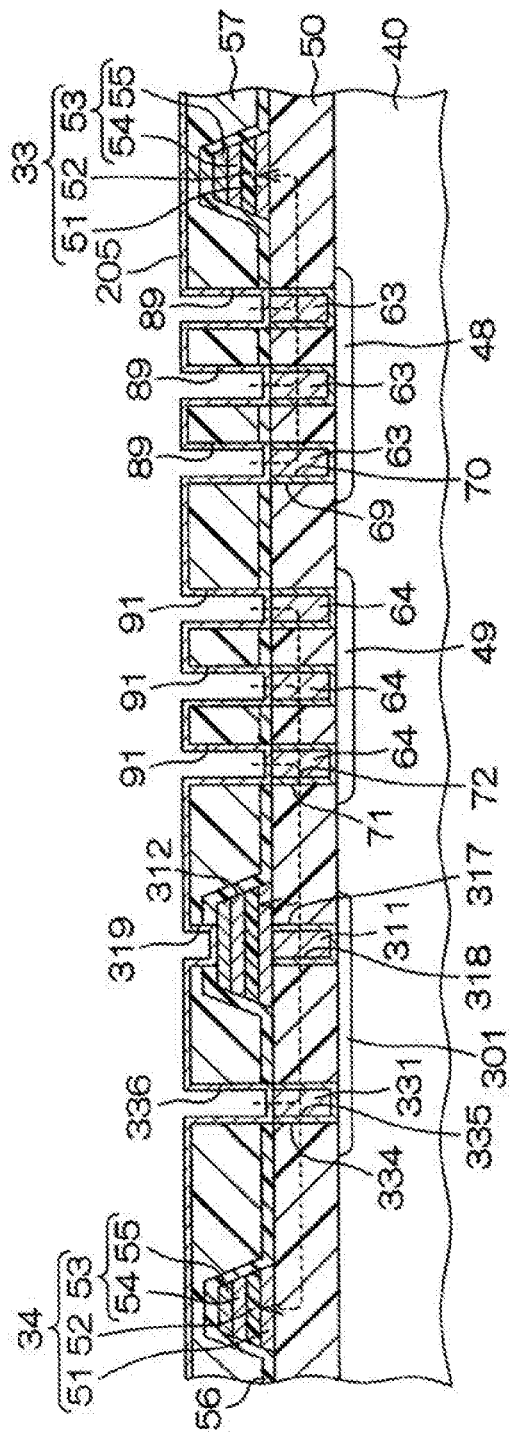

Next, as illustrated in FIGS. 8H and 9H, photolithography and etching are performed to form the first via hole 85, the second via hole 87, the third via hole 89, the fourth via hole 91, the seventh via hole 319, and the eighth via hole 336 in the second interlayer insulating film 57.

In the above instance, the second via hole 87, the third via hole 89, the fourth via hole 91, and the eighth via hole 336, which have a great depth, may be first formed, and then the first via hole 85 and the seventh via hole 319, which have a small depth, may be formed.

Figure 8I:
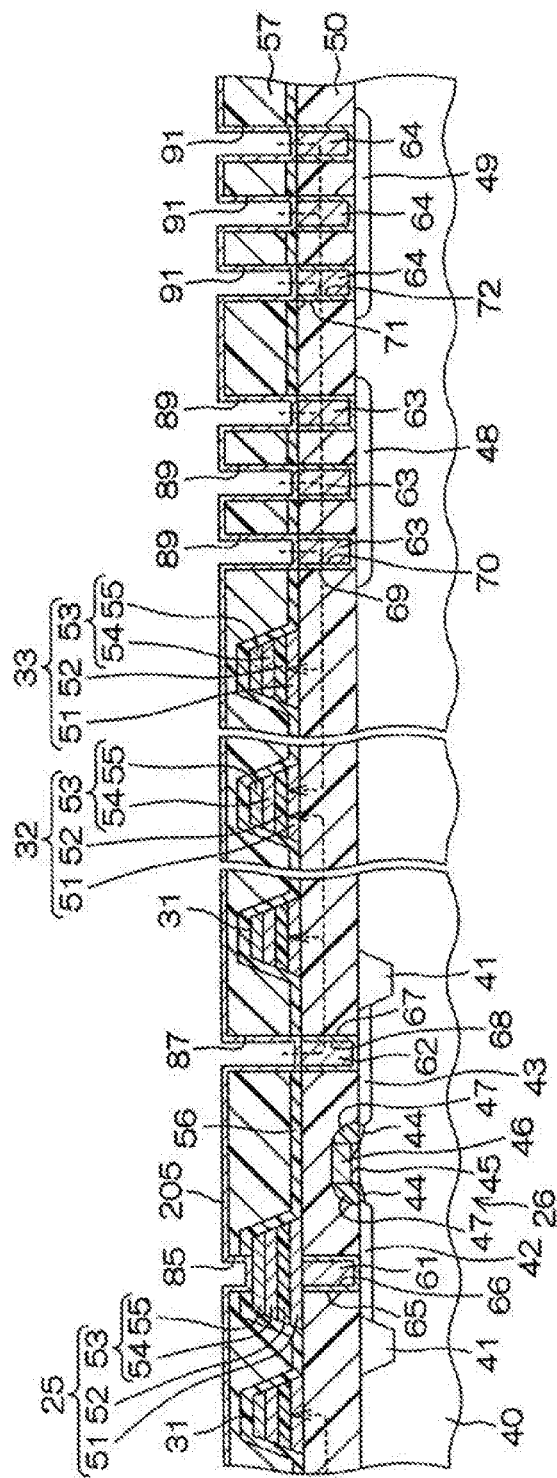
FIG. 8I is a schematic cross-sectional view illustrating a process subsequent to the process illustrated in FIG. 8H.

Subsequently, as illustrated in FIGS. 8I and 9I, the sputtering method is used to form a barrier metal material film 205 on the second interlayer insulating film 57. The barrier metal material film 205 is formed of the materials of the barrier metals 86, 88, 90, 92, 320 and 337. The barrier metal material film 205 is also formed on the inner surfaces (lateral and basal surfaces) of the first via hole 85, second via hole 87, third via hole 89, fourth via hole 91, seventh via hole 319, and eighth via hole 336. After the barrier metal material film 205 is formed, hydrogen is used to reform the barrier metal material film 205 in order to improve its barrier properties.

For the above reform process, hydrogen (hydrogen plasma) is used. As indicated by broken lines in FIGS. 8I and 9I, the hydrogen used for the reform process passes through the first to fourth, seventh, and eighth via holes 85, 87, 89, 91, 319 and 336 and the first interlayer insulating film 50, and is absorbed by the ferroelectric film 52 in the dummy capacitors 31 to 34 and 312. This makes it possible to decrease the amount of hydrogen that passes through the first to fourth, seventh, and eighth via holes 85, 87, 89, 91, 319 and 336 and the first interlayer insulating film 50 and then enters the ferroelectric film 52 in the real capacitor 25. As a result, it is possible to suppress the characteristics of the real capacitor 25 from deteriorating.

The present embodiment is configured so that, within the nonvolatile logic region 13, the second and third dummy capacitors 32 and 33 are additionally disposed around the nonvolatile logic cell 21 as viewed from above. Therefore, as compared to a case where dummy capacitors are disposed only in the nonvolatile logic cell 21 as viewed from above, an increased amount of hydrogen can be absorbed by the dummy capacitors. This makes it possible to effectively suppress the characteristics of the real capacitor 25 from deteriorating.

Further, the present embodiment is configured so that the fourth dummy capacitor 34 is additionally disposed in the scribe region 3. Therefore, a further increased amount of hydrogen can be absorbed by the dummy capacitors. This makes it possible to more effectively suppress the characteristics of the real capacitor 25 from deteriorating.

A large number of via holes 89 and 91 are formed particularly in the guard ring 20, which has the ground line 35 and the power supply line 36. Therefore, when the barrier metal material film 205 on the inner surfaces of the via holes 89 and 91 is reformed, a large amount of hydrogen passes through the via holes 89 and 91 and enters the first interlayer insulating film 50. In the present embodiment, a large number of third dummy capacitors 33 are additionally formed in the gap region 13C inside the guard ring region 13B. Therefore, the hydrogen passing through the via holes 89 and 91 and entering the first interlayer insulating film 50 can be efficiently absorbed by such capacitors. This makes it possible to more effectively suppress the characteristics of the real capacitor 25 from deteriorating.

Figure 8J:
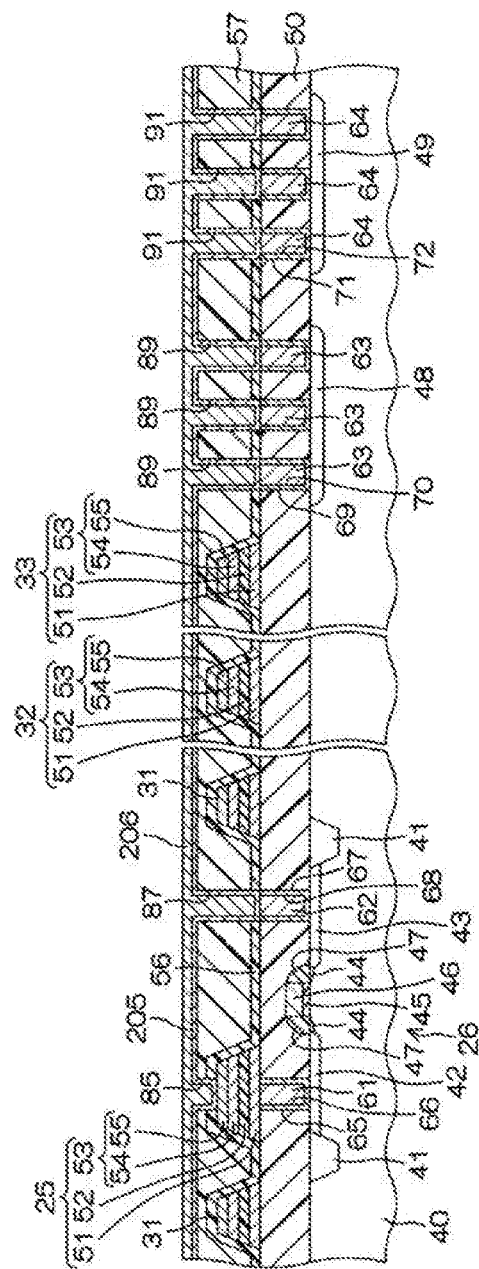
FIG. 8J is a schematic cross-sectional view illustrating a process subsequent to the process illustrated in FIG. 8I.
Figure 9J:
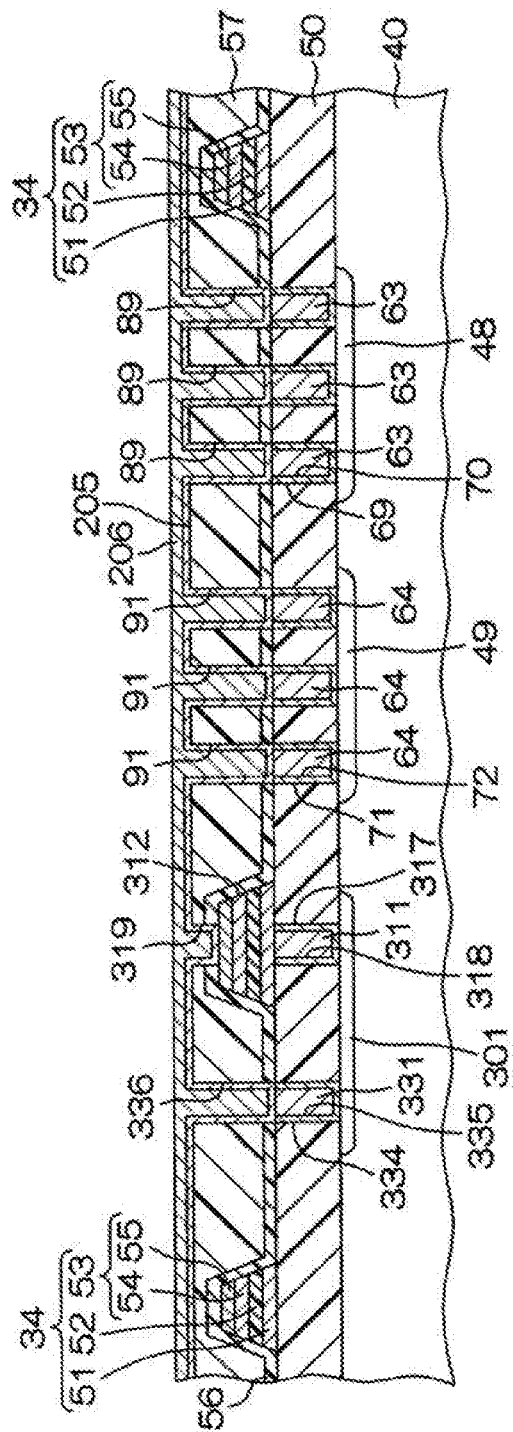
FIG. 9J is a schematic cross-sectional view illustrating a process subsequent to the process illustrated in FIG. 9I.

Upon completion of the reform process on the barrier metal material film 205, a deposited layer 206 formed of the materials of the first to fourth, seventh, and eighth via plugs 81 to 84, 313 and 332 is layered on the barrier metal material film 205 by using the CVD method as illustrated in FIGS. 8J and 9J. The CMP method is then used to polish the deposited layer 206 and the barrier metal material film 205. This polishing continues until unnecessary portions formed outside the first to fourth, seventh, and eighth via holes 85, 87, 89, 91, 319 and 336 in the barrier metal material film 205 and the deposited layer 206 are removed so that the surface of the deposited layer 206 remaining inside the via holes 85, 87, 89, 91, 319 and 336 is flush with the surface (upper surface) of the second interlayer insulating film 57.

Figure 8K:
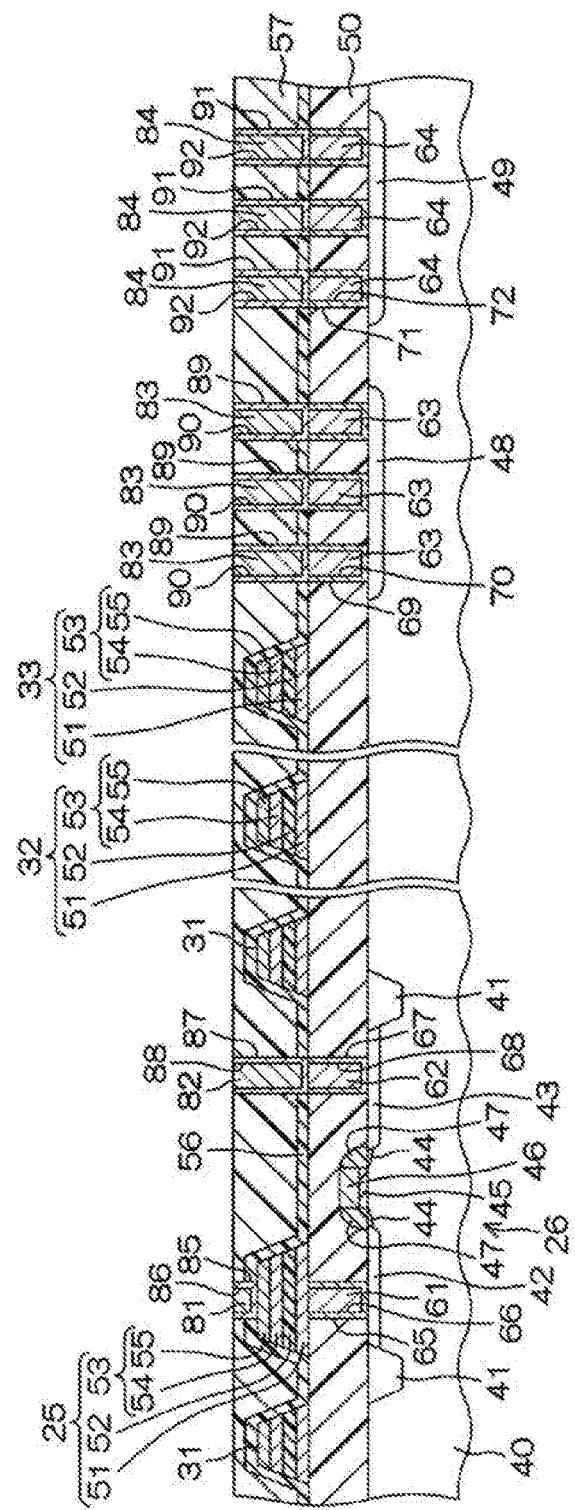
FIG. 8K is a schematic cross-sectional view illustrating a process subsequent to the process illustrated in FIG. 8J.
Figure 9K:
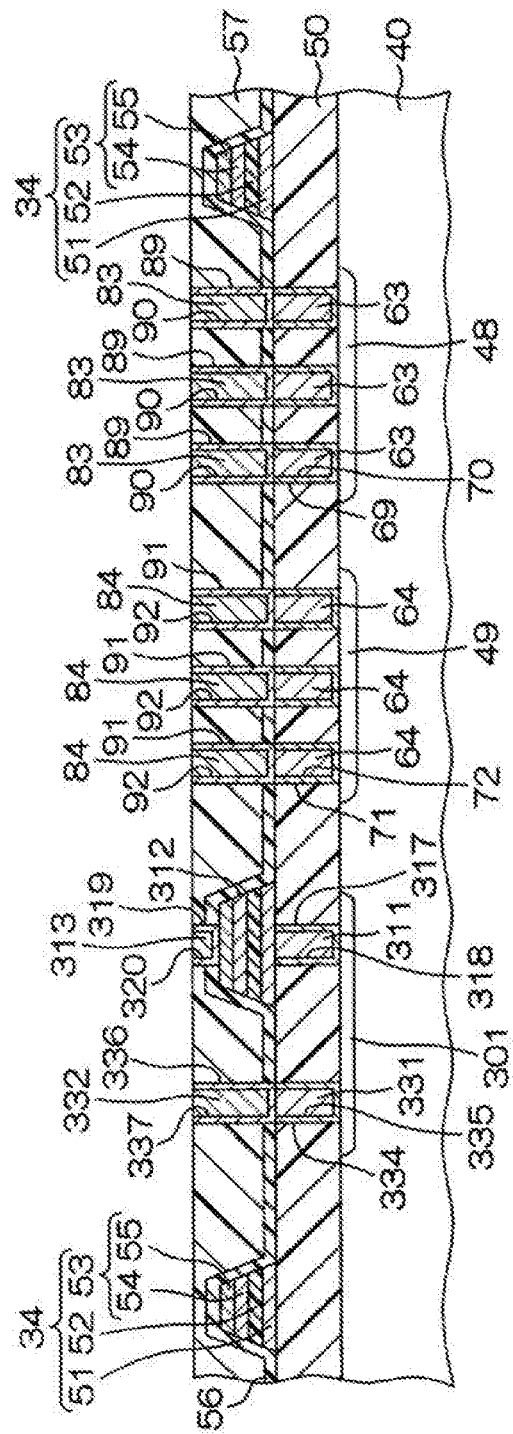
FIG. 9K is a schematic cross-sectional view illustrating a process subsequent to the process illustrated in FIG. 9J.

As a result, the first via plug 81, which is embedded in the first via hole 85 through the barrier metal 86, and the second via plug 82, which is embedded in the second via hole 87 through the barrier metal 88, are formed as illustrated in FIGS. 8K and 9K. Further, the third via plug 83, which is embedded in the third via hole 89 through the barrier metal 90, and the fourth via plug 84, which is embedded in the fourth via hole 91 through the barrier metal 92, are formed. Furthermore, the seventh via plug 313, which is embedded in the seventh via hole 319 through the barrier metal 320, and the eighth via plug 332, which is embedded in the eighth via hole 336 through the barrier metal 337, are formed.

Figure 8L:
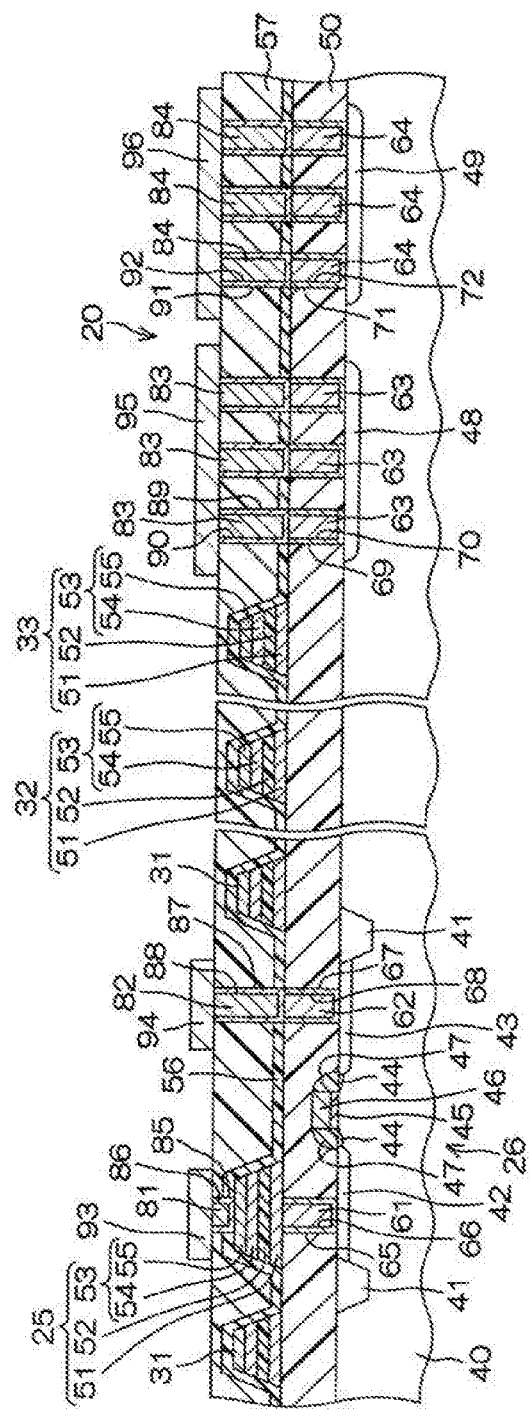
FIG. 8L is a schematic cross-sectional view illustrating a process subsequent to the process illustrated in FIG. 8K.
Figure 9L:
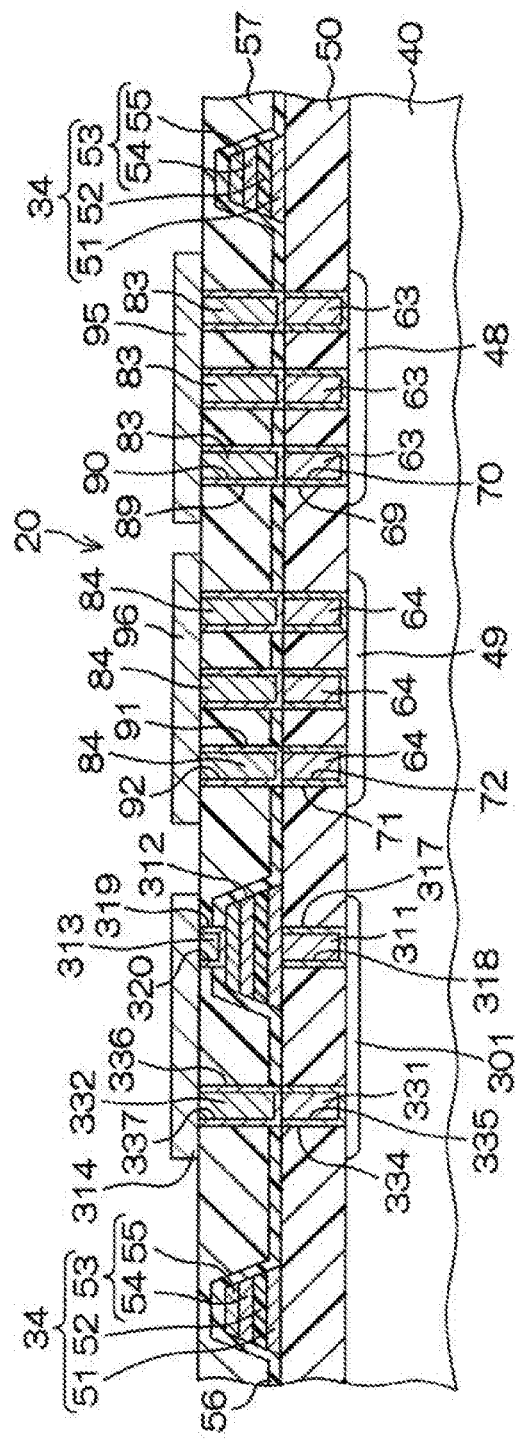
FIG. 9L is a schematic cross-sectional view illustrating a process subsequent to the process illustrated in FIG. 9K.

Next, as illustrated in FIGS. 8L and 9L, a wiring film formed of a conductive material is formed on the second interlayer insulating film 57. The wiring film is formed, for example, of a layered film including a titanium layer, an aluminum layer, and a titanium layer. Subsequently, photolithography and etching are performed to pattern the wiring film in such a manner as to simultaneously form wirings such as the first wiring 93, the second wiring 94, the ground line 95, the power supply line 96, and the first common shield wiring 314.

Figure 8M:
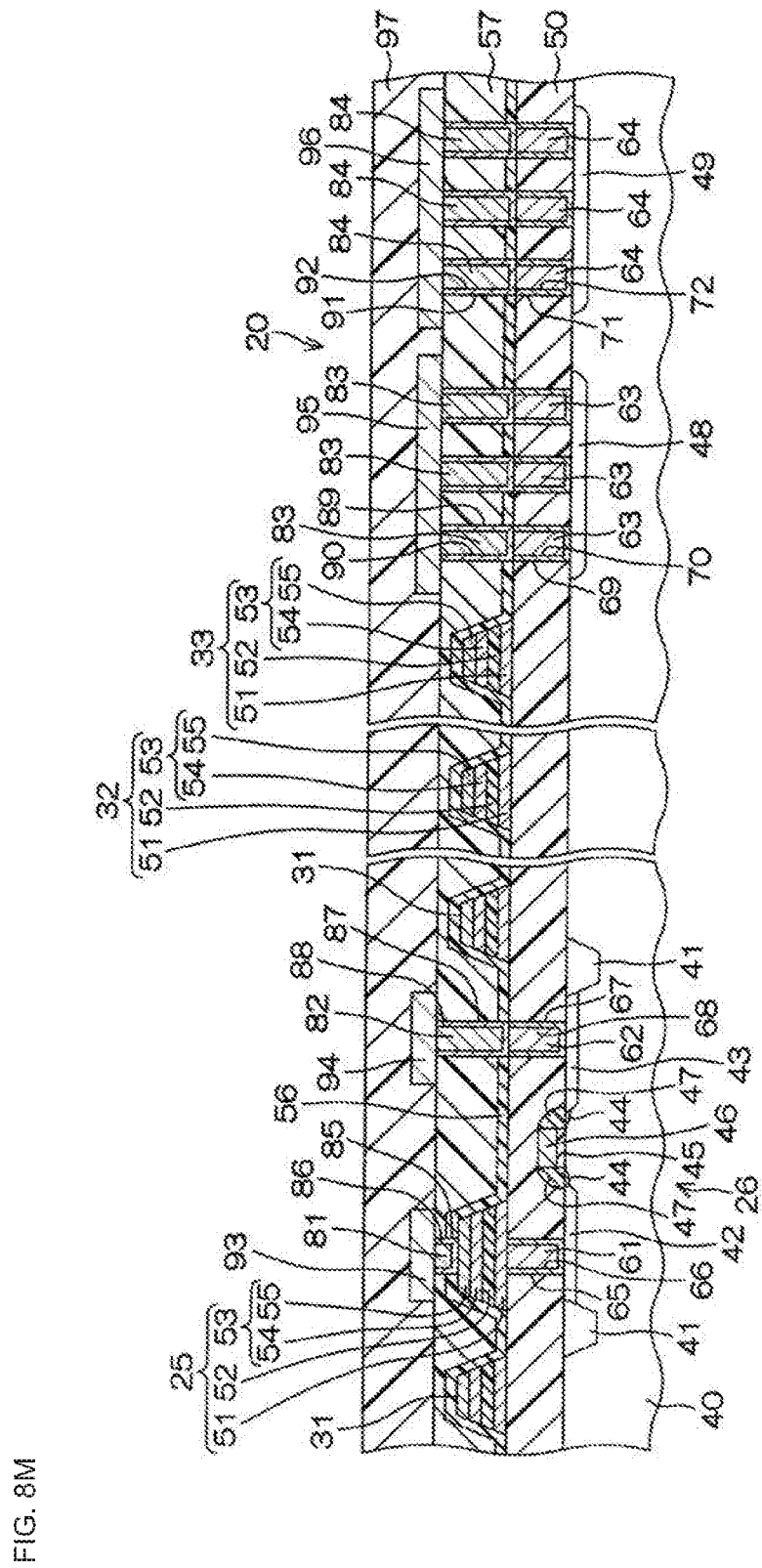
FIG. 8M is a schematic cross-sectional view illustrating a process subsequent to the process illustrated in FIG. 8L.
Figure 9M:
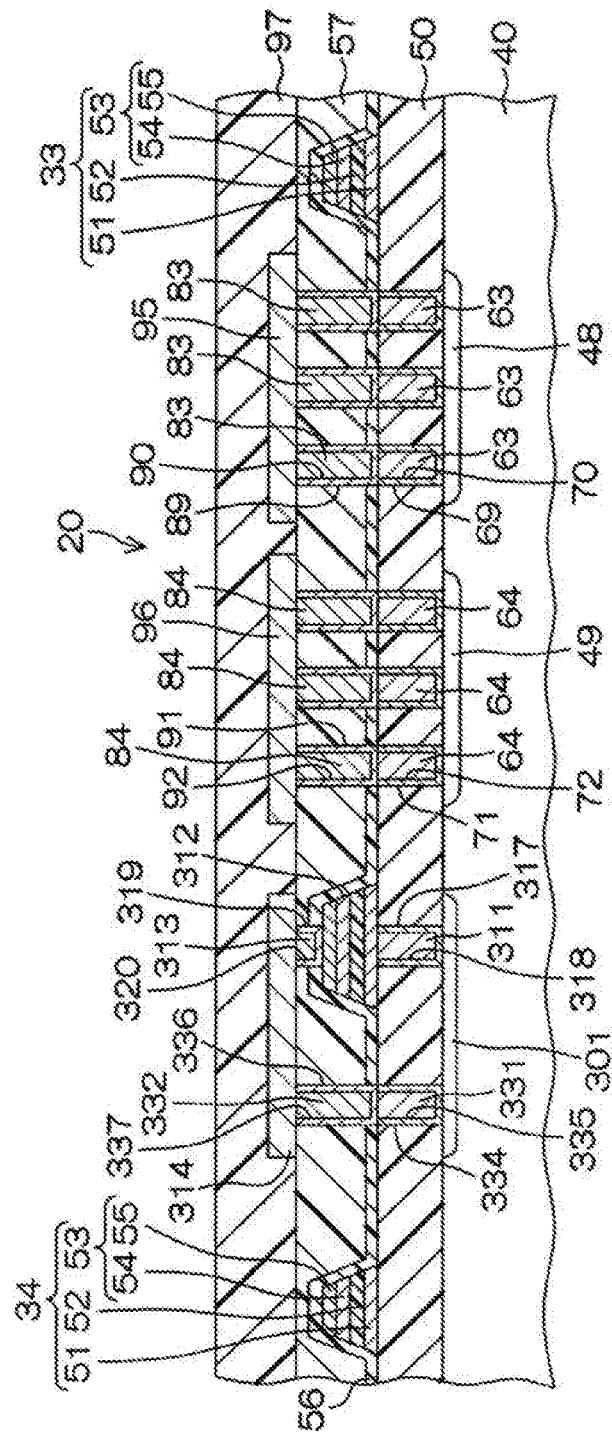
FIG. 9M is a schematic cross-sectional view illustrating a process subsequent to the process illustrated in FIG. 9L.

Next, as illustrated in FIGS. 8M and 9M, the CVD method is used to form the third interlayer insulating film 97 on the second interlayer insulating film 57 and on the first wiring 93, the second wiring 94, the ground line 95, the power supply line 96, and the first common shield wiring 314.

Figure 8N:
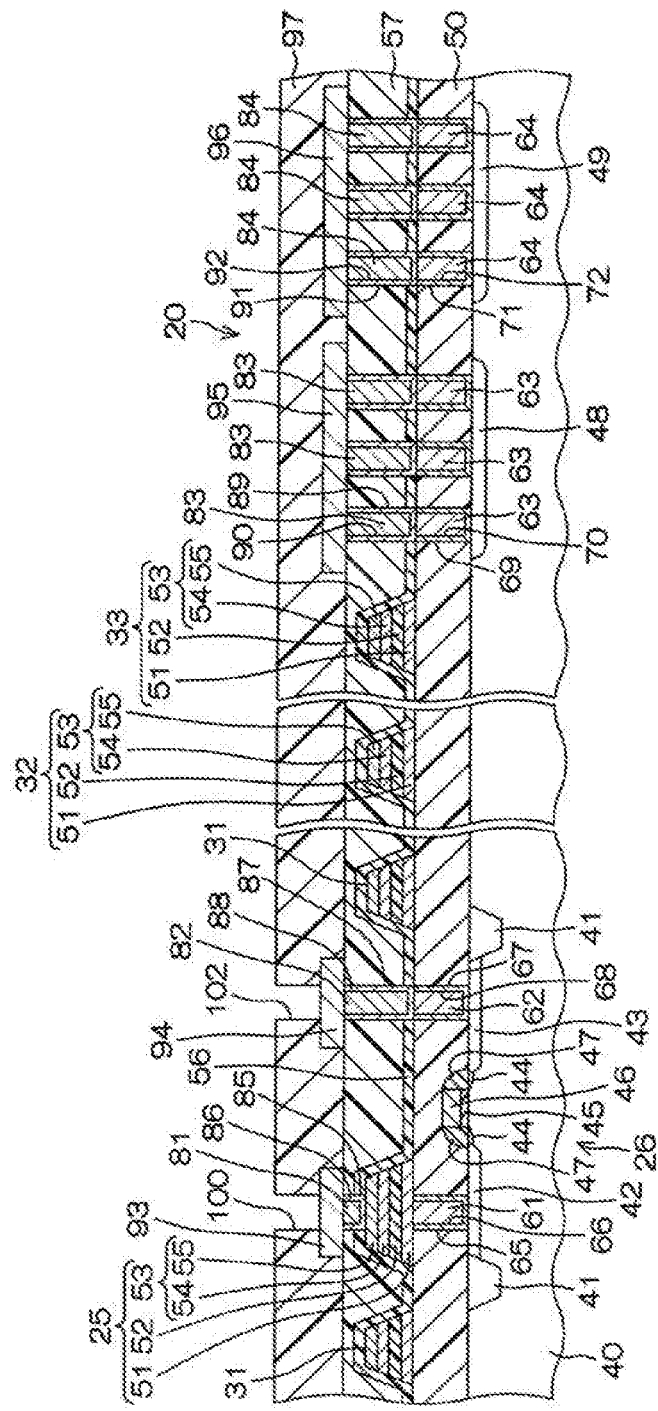
FIG. 8N is a schematic cross-sectional view illustrating a process subsequent to the process illustrated in FIG. 8M.
Figure 80:
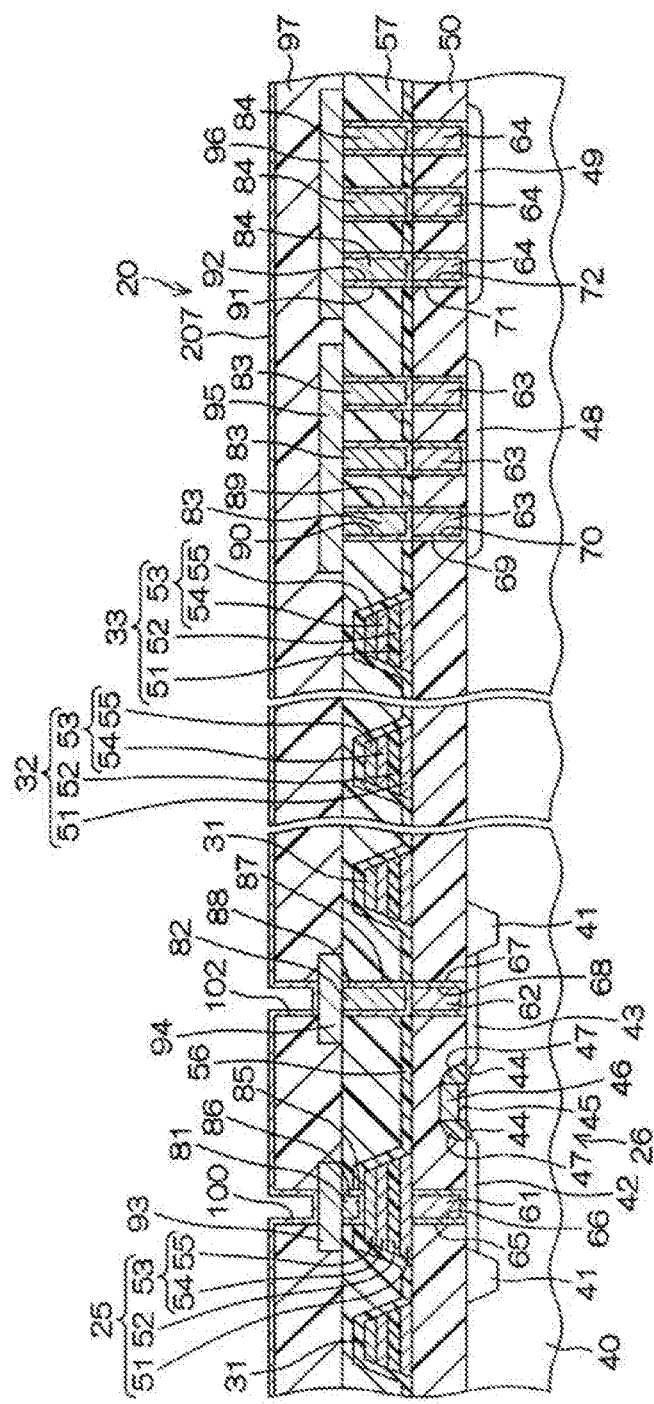
Figure 9N:
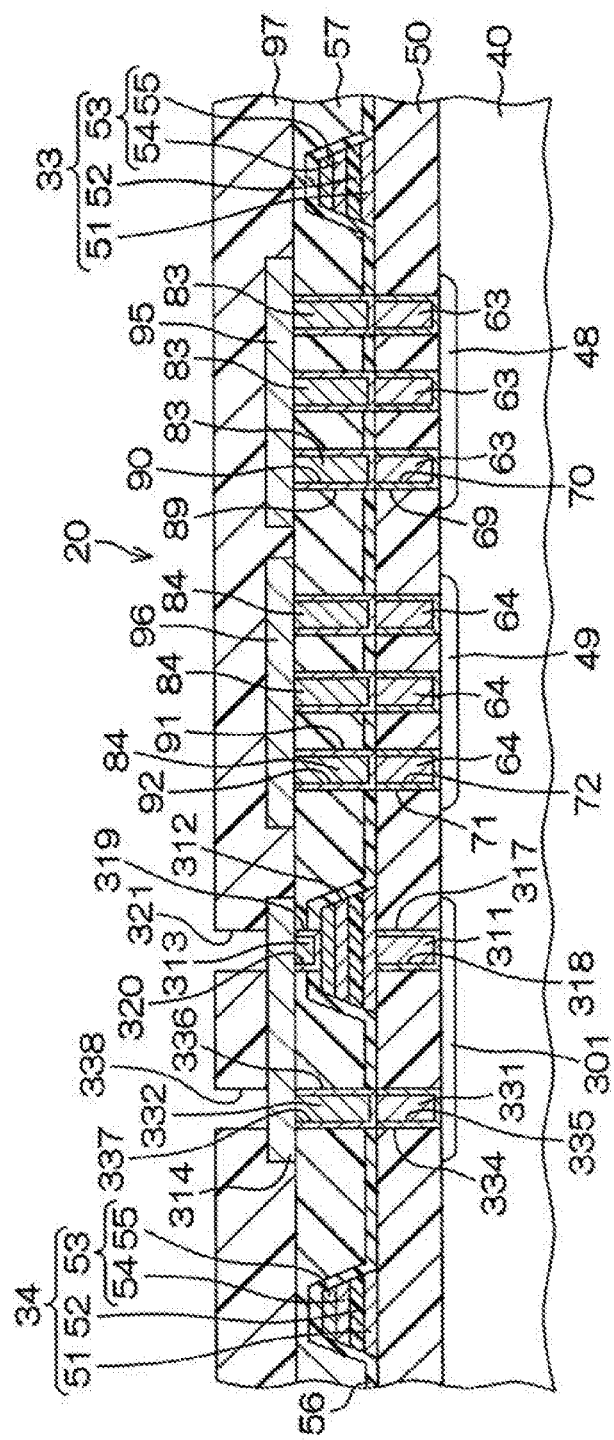
FIG. 9N is a schematic cross-sectional view illustrating a process subsequent to the process illustrated in FIG. 9M.
Figure 90:
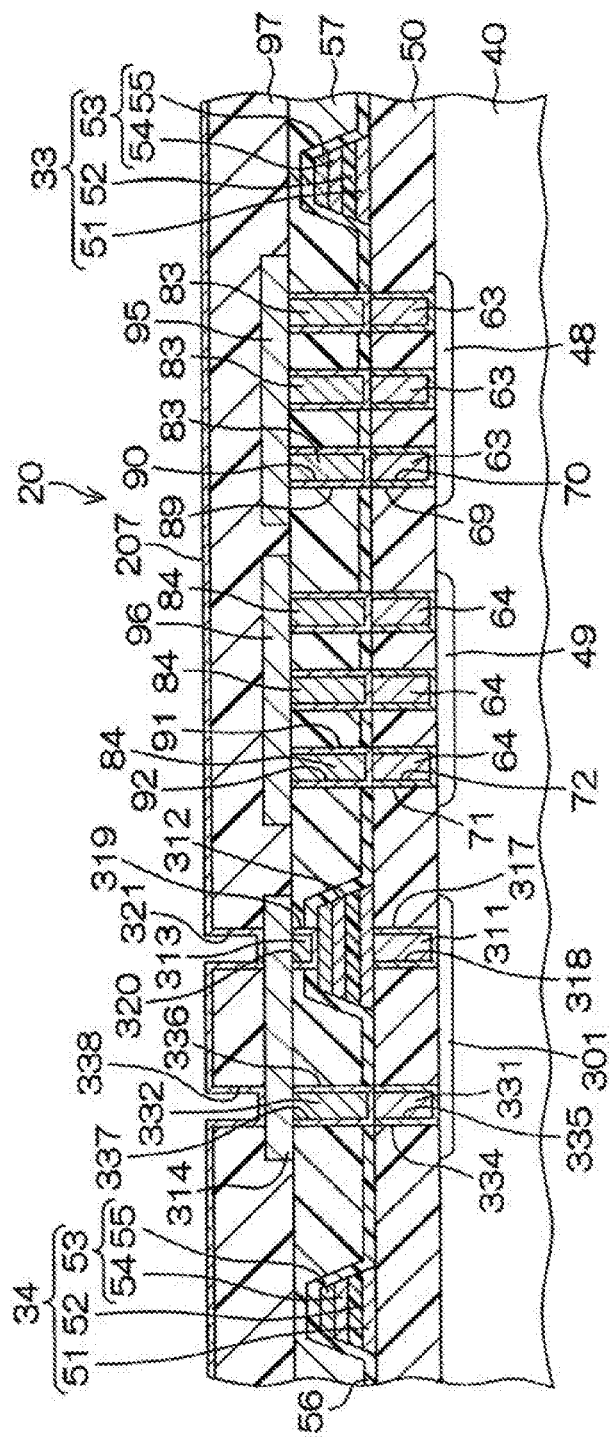

Next, as illustrated in FIGS. 8N and 9N, photolithography and etching are performed to form the fifth via hole 100, the sixth via hole 102, the ninth via hole 321, and the tenth via hole 338 in the third interlayer insulating film 97.

Subsequently, as illustrated in FIGS. 8O and 9O, the sputtering method is used to form a barrier metal material film 207 on the third interlayer insulating film 97. The barrier metal material film 207 is formed of the materials of the barrier metals 101, 103, 322 and 339. The barrier metal material film 207 is also formed on the inner surfaces (lateral and basal surfaces) of the fifth via hole 100, sixth via hole 102, ninth via hole 321, and tenth via hole 338. After the barrier metal material film 207 is formed, hydrogen is used to reform the barrier metal material film 207 in order to improve its barrier properties.

For the above reform process, too, hydrogen (hydrogen plasma) is used. The hydrogen used for the reform process passes through the fifth via hole 100, the sixth via hole 102, the ninth via hole 321, the tenth via hole 338, the third interlayer insulating film 97, and the second interlayer insulating film 57, and is absorbed by the ferroelectric film 52 in the dummy capacitors 31 to 34 and 312. This makes it possible to decrease the amount of hydrogen that enters the ferroelectric film 52 in the real capacitor 25. As a result, it is possible to suppress the characteristics of the real capacitor 25 from deteriorating.

Upon completion of the reform process on the barrier metal material film 207, a deposited layer formed of the materials of the fifth via plug 98, sixth via plug 99, ninth via plug 315, and tenth via plug 333 is layered on the barrier metal material film 207 by using the CVD method. The CMP method is then used to polish the deposited layer and the barrier metal material film 207. This polishing continues until unnecessary portions formed outside the fifth, sixth, ninth, and tenth via holes 100, 102, 321 and 338 in the barrier metal material film 207 and the deposited layer are removed so that the surface of the deposited layer remaining in the via holes 100, 102, 321 and 338 is flush with the surface (upper surface) of the third interlayer insulating film 97.

Figure 9P:
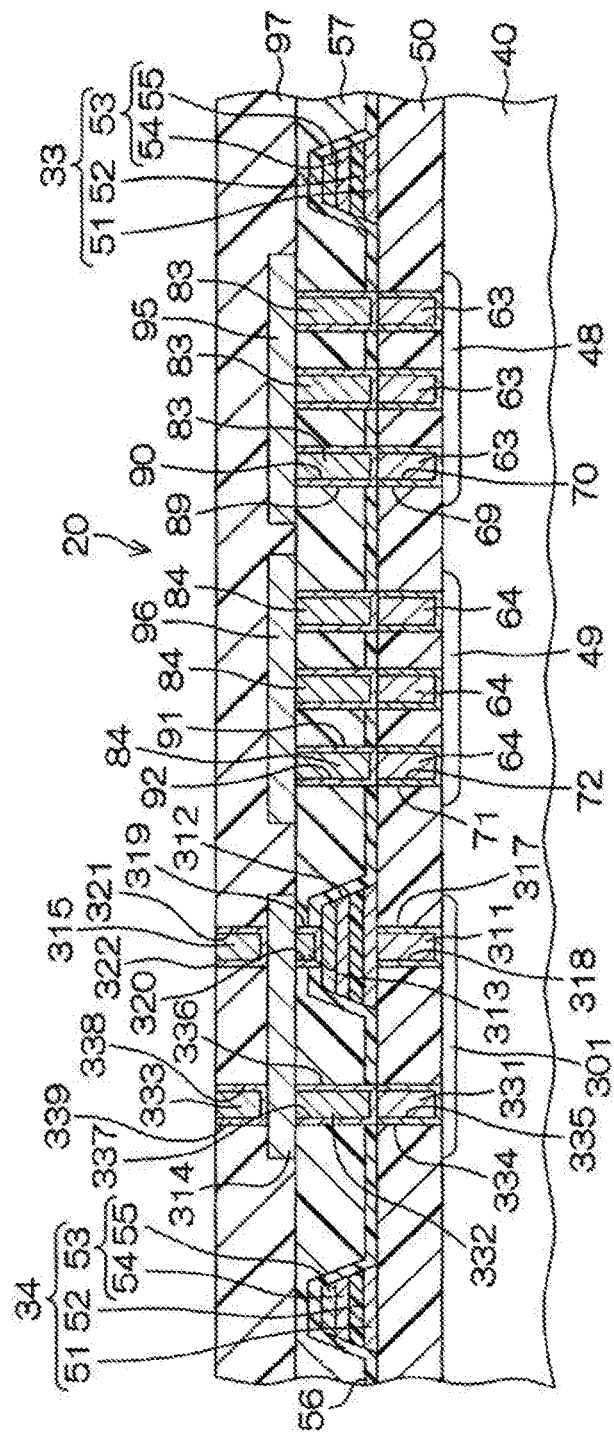
FIG. 9P is a schematic cross-sectional view illustrating a process subsequent to the process illustrated in FIG. 9O.

As a result, the fifth via plug 98, which is embedded in the fifth via hole 100 through the barrier metal 101, and the sixth via plug 99, which is embedded in the sixth via hole 102 through the barrier metal 103, are formed as illustrated in FIGS. 8P and 9P. Further, the ninth via plug 315, which is embedded in the ninth via hole 321 through the barrier metal 322, and the tenth via plug 333, which is embedded in the tenth via hole 338 through the barrier metal 339, are formed.

Figure 8Q:
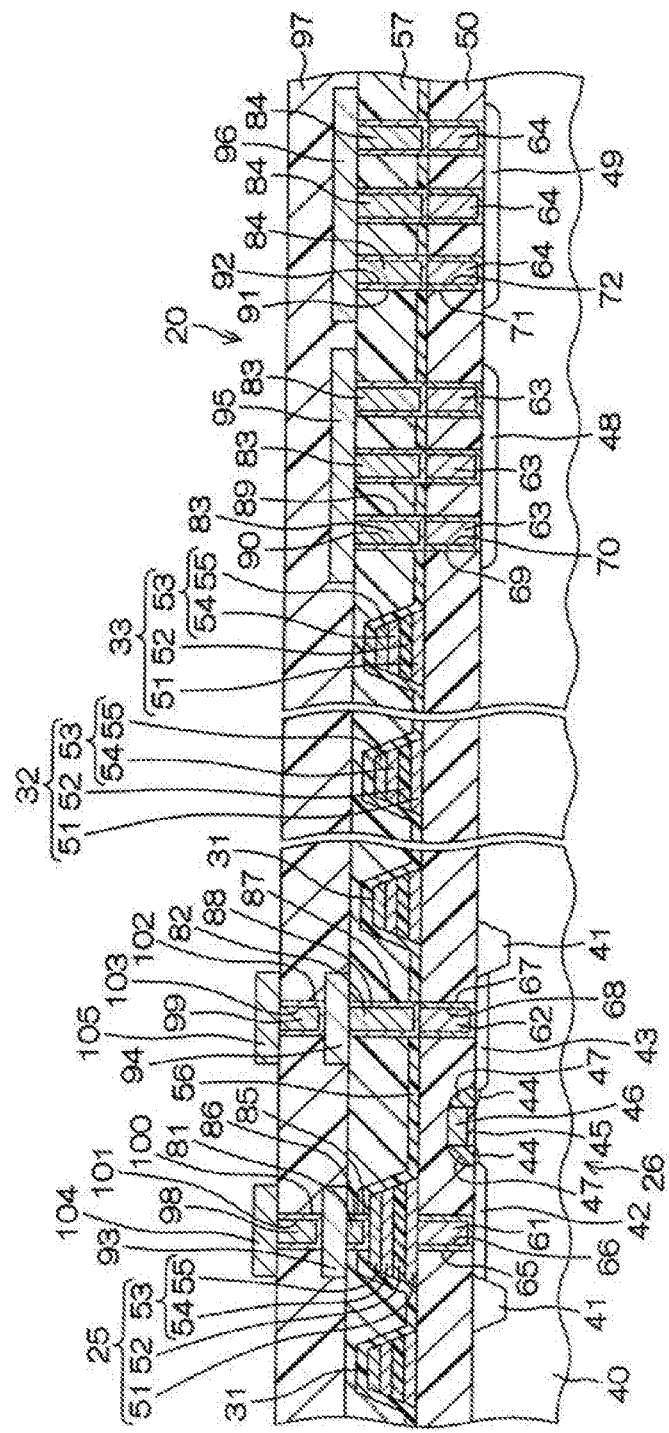
FIG. 8Q is a schematic cross-sectional view illustrating a process subsequent to the process illustrated in FIG. 8P.
Figure 9Q:
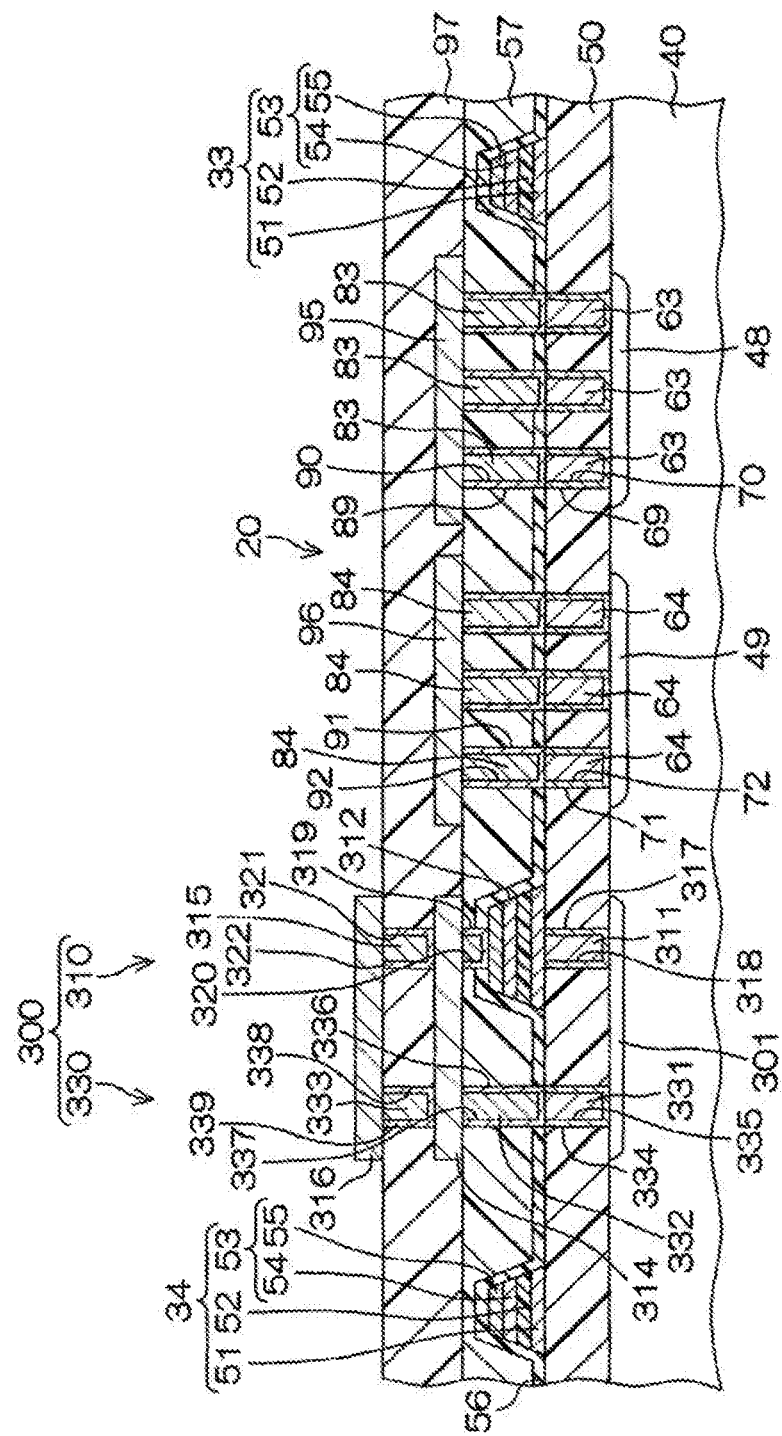
FIG. 9Q is a schematic cross-sectional view illustrating a process subsequent to the process illustrated in FIG. 9P.

Next, as illustrated in FIGS. 8Q and 9Q, a wiring film formed of a conductive material is formed on the third interlayer insulating film 97. The wiring film is formed, for example, of a layered film including a titanium layer, an aluminum layer, and a titanium layer. Subsequently, photolithography and etching are performed to pattern the wiring film in such a manner as to simultaneously form wirings such as the third wiring 104, the fourth wiring 105, and the second common shield wiring 316. For example, the nonvolatile logic, the guard ring 20, the dummy capacitors 31 to 34, and the shield ring 300 are manufactured in this manner.

When the semiconductor wafer 1 illustrated, for instance, in FIG. 1 is manufactured, for example, through the above-described processes, the scribe region 3 of the semiconductor wafer 1 is cut by a dicing blade to obtain individual semiconductor devices 4 having the functional element region 2. The individual semiconductor devices 4 cut out in the above manner each include the scribe region 3 on its periphery and include the functional element region 2 within the central region surrounded by the scribe region 3. In the foregoing embodiment, the fourth dummy capacitor 34 is formed in the whole scribe region 3. Therefore, the fourth dummy capacitor 34 formed in the scribe region 3 remains on the periphery of each semiconductor device 4.

In the foregoing embodiment, plasma is generated in the manufacturing process of a semiconductor device 4. The plasma is generated particularly in a process of forming the real capacitor 25 and the dummy capacitors 31 to 34 and 312 by dry-etching the material film of a capacitor and in a process of forming the hydrogen barrier film 56 on these capacitors 25, 31 to 34 and 312.

The bottom electrode material film 201 in a region of the capacitor material film where the real capacitor 25 is to be formed or the bottom electrode 51 of the real capacitor 25 is electrically connected to the drain region 42 of the semiconductor substrate 40 through the first contact plug 61. Therefore, if plasma is generated in the above-mentioned processes, charged particles in the plasma pass through the first conductive path that includes the first contact plug 61, the semiconductor substrate 40, and the bottom electrode material film 201 in the region where the real capacitor 25 is to be formed or the bottom electrode 51 of the real capacitor 25. As this causes a large current flow in the first conductive path, the junction between the first contact plug 61 and the bottom electrode 51 of the real capacitor 25 is oxidized to increase the interface resistance between the first contact plug 61 and the bottom electrode 51 of the real capacitor 25. The larger the current flow in the first conductive path, the higher the degree of oxidation.

The present embodiment has the real capacitor oxidation suppression structure ST that includes the fifth dummy capacitor 312 and the fifth contact plug 311. Therefore, when plasma is generated in the above-mentioned processes, the charged particles in the plasma pass through the second conductive path that includes the fifth contact plug 311, the semiconductor substrate 40, and the bottom electrode material film 201 in a region where the fifth dummy capacitor 312 is to be formed or the bottom electrode 51 of the fifth dummy capacitor 312. In other words, a current additionally flows in the second conductive path. Therefore, as compared to a case where the real capacitor oxidation suppression structure ST (fifth dummy capacitor 312) is not formed, the current flow in the first conductive path can be decreased. This makes it possible to suppress the oxidation of the junction between the first contact plug 61 and the bottom electrode 51 of the real capacitor 25. Consequently, the interface resistance between the first contact plug 61 and the bottom electrode 51 of the real capacitor 25 can be decreased.

In the present embodiment, the fifth dummy capacitor 312 and the fifth contact plug 311 are shaped like a rectangular ring as viewed from above. Therefore, the cross-sectional area of the second conductive path is larger than that of each first conductive path. Further, while the first contact plug 61 is connected to the high-impedance n+-type drain region 42 formed on the surface layer of the p-type semiconductor substrate 40, the fifth contact plug 311 is connected to the low-impedance p-type diffusion region 301 formed on the surface layer of the p-type semiconductor substrate 40. Therefore, in the above-mentioned manufacturing process, a current more readily flows in the second conductive path than in the first conductive path. This makes it possible to effectively decrease the interface resistance between the first contact plug 61 and the bottom electrode 51 of the real capacitor 25.

Further, in the present embodiment, the fifth dummy capacitor 312 and the fifth contact plug 311 are formed as parts of the shield ring 300. Therefore, no extra space is required for forming the fifth dummy capacitor 312 and the fifth contact plug 311.

In the foregoing embodiment, hydrogen (hydrogen plasma) is used in the manufacturing process of the semiconductor device 4, particularly, in the reform process performed after the barrier metals 66, 68, 70, 72, 320 and 337 are formed in the via holes (mainly in the first to fourth, seventh, and eighth via holes 85, 87, 89, 91, 319 and 336). The guard ring 20, in particular, includes the ground line 35 and the power supply line 36, and thus contains a large number of via holes 89 and 91. Therefore, when the reform process is performed on the barrier metal material films on the inner surfaces of the via holes 89 and 91, a large amount of hydrogen passes through the via holes 89 and 91 and enters the first interlayer insulating film 50.

The foregoing embodiment is configured so that, within the nonvolatile logic region 13, the second and third dummy capacitors 32 and 33 are additionally disposed around the nonvolatile logic cell 21. Therefore, the hydrogen used in the reform process performed after the barrier metals 66, 68, 70, 72, 320 and 337 are formed in the via holes 85, 87, 89, 91, 319 and 336 can be absorbed by the second and third dummy capacitors 32 and 33. Consequently, hydrogen reduction of the ferroelectric film 52 in the real capacitor 25 can be prevented. This makes it possible to suppress the characteristics of the real capacitor 25 from deteriorating.

Further, in the present embodiment, a plurality of the third dummy capacitors 33 are additionally formed in the gap region 13C inside the guard ring region 13B. Therefore, when the reform process is performed on the barrier metal material films on the inner surfaces of the via holes 89 and 91 in the guard ring 20, the hydrogen passing through the via holes 89 and 91 and entering the first interlayer insulating film 50 can be efficiently absorbed by these dummy capacitors 33. This makes it possible to effectively suppress the characteristics of the real capacitor 25 from deteriorating.

Moreover, in the present embodiment, a plurality of the fourth dummy capacitors 34 are additionally disposed in the scribe region 3. Therefore, a further increased amount of hydrogen can be absorbed by the fourth dummy capacitors 34. This makes it possible to more effectively suppress the characteristics of the real capacitor 25 from deteriorating.

While the embodiment of the present invention has been described, the present invention may also be implemented in alternative embodiments.

Figure 10:
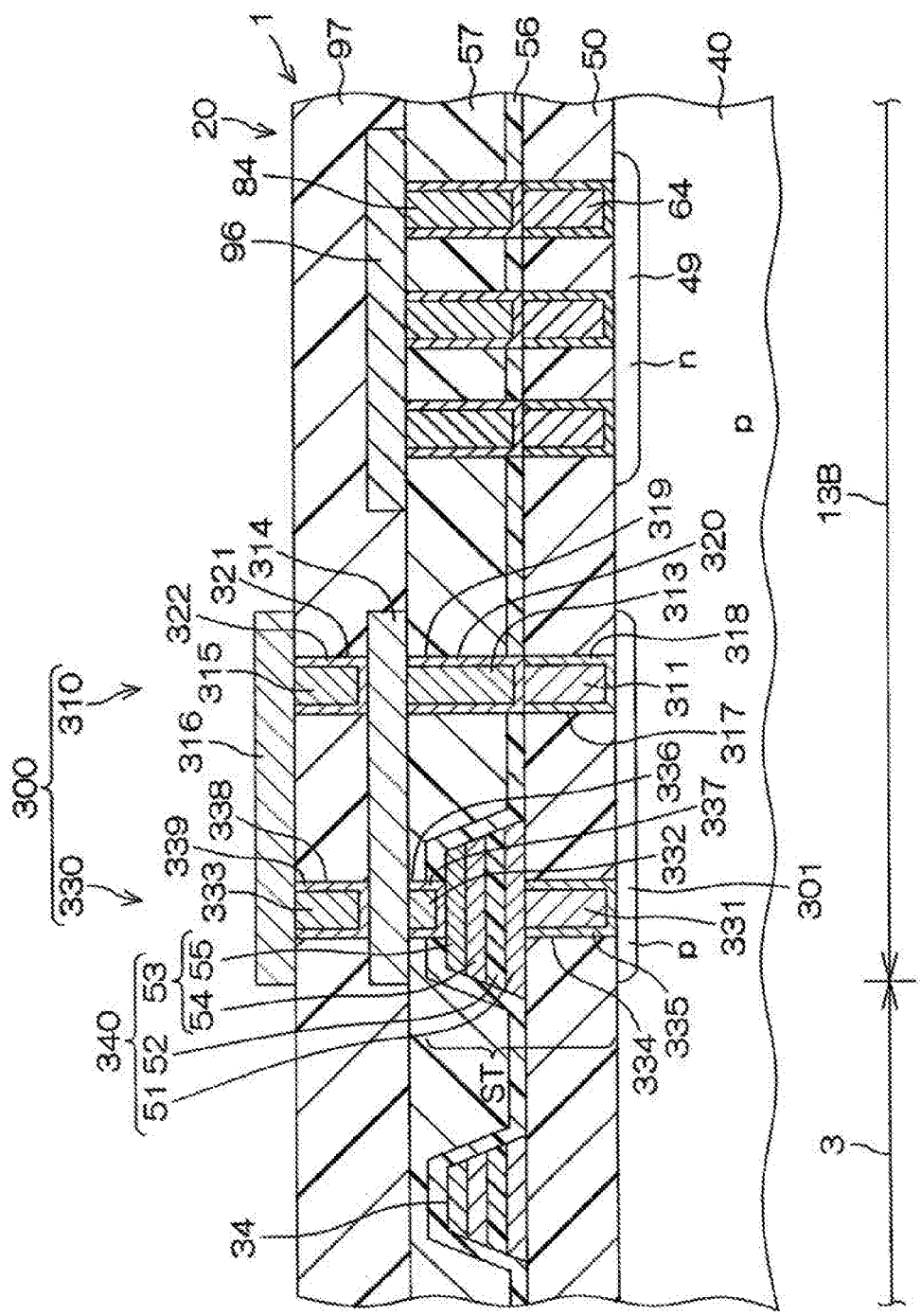
FIG. 10 is a schematic cross-sectional view illustrating an exemplary modification of the shield ring. This cross-sectional view corresponds to FIG. 7B.

For example, the foregoing embodiment includes the first shield ring 310, which is inward positioned and shaped like a rectangular ring as viewed from above, and the second shield ring 330, which is outward positioned and shaped like a rectangular ring as viewed from above. However, the real capacitor oxidation suppression structure ST is formed only for the inward positioned first shield ring 310. Meanwhile, as illustrated in FIG. 10, the real capacitor oxidation suppression structure ST may alternatively be formed only for the outward positioned second shield ring 330 shaped like a rectangular ring as viewed from above instead of the inward positioned first shield ring 310 shaped like a rectangular ring as viewed from above. FIG. 10 is a cross-sectional view corresponding to FIG. 7B.

In the above case, as illustrated in FIG. 10, the first shield ring 310 includes the fifth contact plug 311, the seventh via plug 313, the first common shield wiring 314, the ninth via plug 315, and the second common shield wiring 316, which are shaped like a rectangular ring as viewed from above. The seventh via plug 313 penetrates the second interlayer insulating film 57 and electrically connects the fifth contact plug 311 to the first common shield wiring 314.

Meanwhile, the second shield ring 330 includes, as illustrated in FIG. 10, the sixth contact plug 331, a dummy ferroelectric capacitor (sixth dummy capacitor) 340, the eighth via plug 332, the first common shield wiring 314, the tenth via plug 333, and the second common shield wiring 316, which are shaped like a rectangular ring as viewed from above. The sixth dummy capacitor 340 is formed on the second interlayer insulating film 57. The sixth dummy capacitor 340 has the same structure as the fifth dummy capacitor 312 depicted in FIG. 7A. The bottom electrode 51 of the sixth dummy capacitor 340 is connected to the sixth contact plug 331. The eighth via plug 332 electrically connects the first common shield wiring 314 to the top electrode 53 of the sixth dummy capacitor 340.

Figure 11:
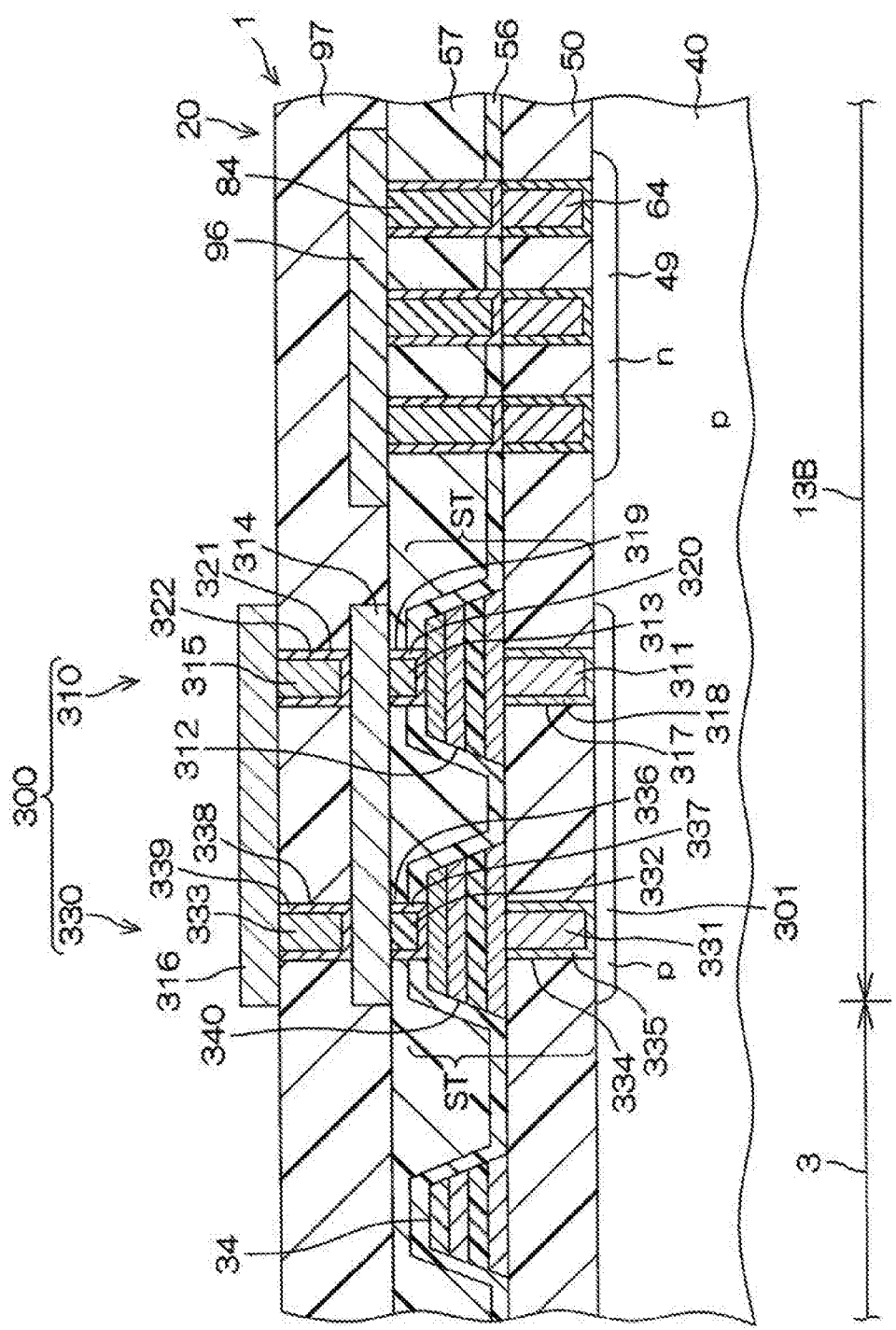
FIG. 11 is a schematic cross-sectional view illustrating another exemplary modification of the shield ring. This cross-sectional view corresponds to FIG. 7B.

Further, as illustrated in FIG. 11, the real capacitor oxidation suppression structure ST may be formed for both the inward positioned first shield ring 310 shaped like a rectangular ring as viewed from above and the outward positioned second shield ring 330 shaped like a rectangular ring as viewed from above. FIG. 11 is a cross-sectional view corresponding to FIG. 7B.

The first shield ring 310 depicted in FIG. 11 has the same structure as the first shield ring 310 in the foregoing embodiment (see FIG. 7B). The second shield ring 330 depicted in FIG. 11 has the same structure as the second shield ring 330 depicted in FIG. 10.

Figure 12:
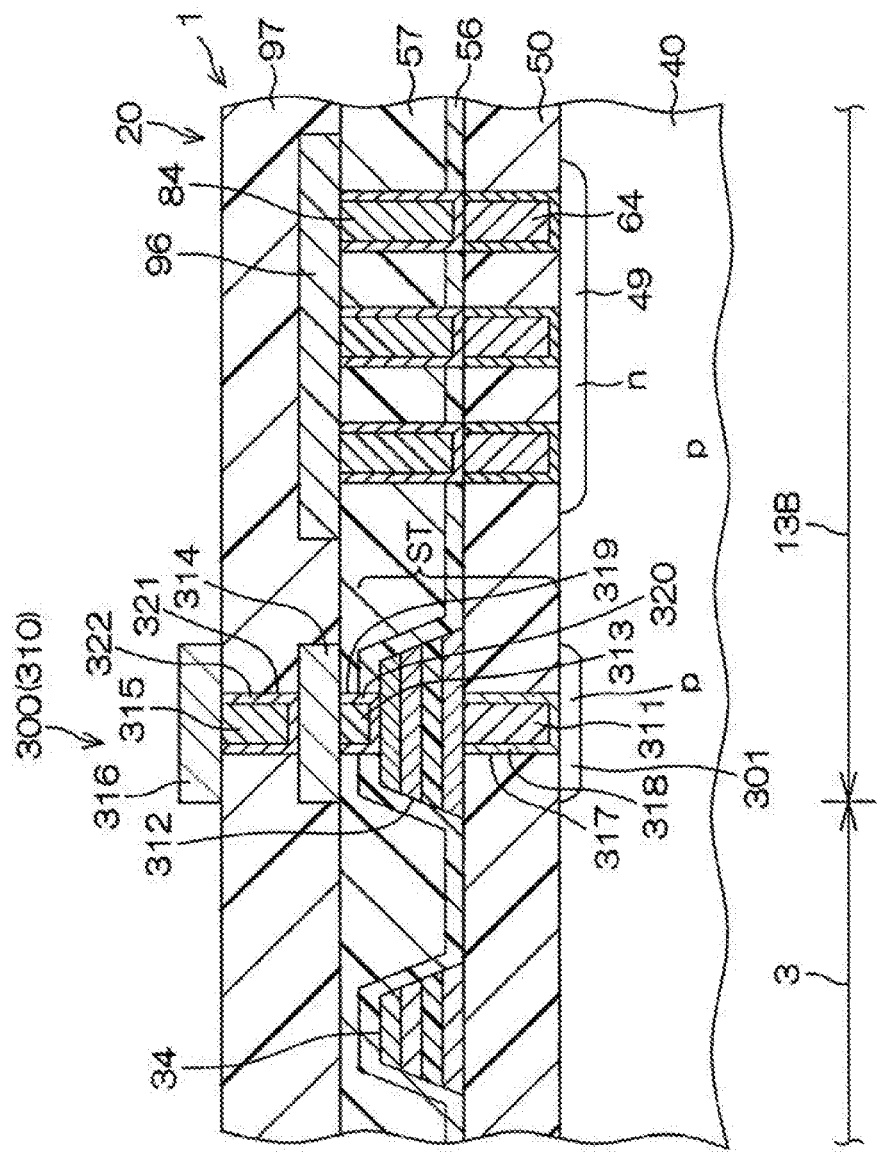
FIG. 12 is a schematic cross-sectional view illustrating still another exemplary modification of the shield ring. This cross-sectional view corresponds to FIG. 7B.

Furthermore, as illustrated in FIG. 12, the shield ring 300 may include only the first shield ring 310 in the foregoing embodiment. FIG. 12 is a cross-sectional view corresponding to FIG. 7B.

In the foregoing embodiment, the first common shield wiring 314 and the second common shield wiring 316 are common to the first shield ring 310 and the second shield ring 330. However, the first common shield wiring 314 may alternatively be provided separately for the first shield ring 310 and for the second shield ring 330. Similarly, the second common shield wiring 316 may alternatively be provided separately for the first shield ring 310 and for the second shield ring 330.

In a case where both the first common shield wiring 314 and the second common shield wiring 316 are provided separately for the first shield ring 310 and for the second shield ring 330, the wirings 314 and 316 for either one of the first shield ring 310 and the second shield ring 330 may be connected to a power source.

In the foregoing embodiment, the real capacitor oxidation suppression structure is formed as a part of a shield ring. However, the real capacitor oxidation suppression structure may be formed separately from the shield ring.

For example, the real capacitor oxidation suppression structure may be shaped like a ring (e.g., a rectangular ring) or a substantial ring (e.g., a substantially rectangular ring) as viewed from above and formed on the periphery of the functional element region 2 separately from the shield ring. Further, the real capacitor oxidation suppression structure may be formed in the guard ring region 13B in a ring-like (e.g., a rectangular ring-like) or substantially ring-like (e.g., substantially rectangular ring-like) manner as viewed from above. Furthermore, the real capacitor oxidation suppression structure having a polygonal, circular, or other shape as viewed from above may be formed like scattered dots within the nonvolatile logic region 13. In any case, as far as the semiconductor substrate 40 is of p-type, it is preferable that a p-type diffusion region be formed on the surface layer of the semiconductor substrate 40 to which a plug within the real capacitor oxidation suppression structure is connected.

Figure 13:
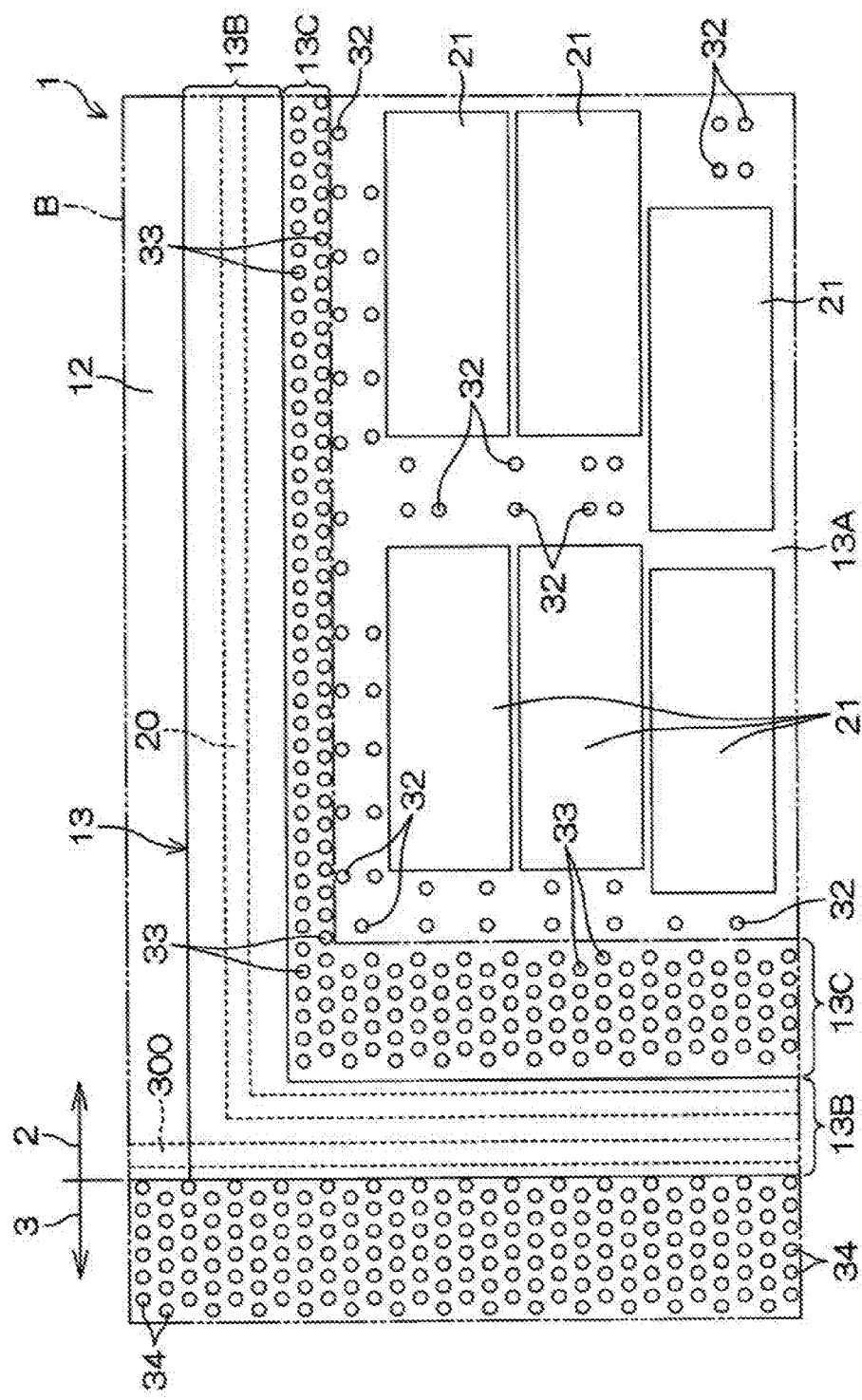
FIG. 13 is a plan view illustrating an alternative exemplary layout of a third dummy capacitor to be formed in a gap region and an alternative exemplary layout of a fourth dummy capacitor to be formed in a scribe region. This plan view corresponds to FIG. 5.

Further, in the foregoing embodiment, the third dummy capacitor 33 formed in the gap region 13C is in a grid pattern as viewed from above. However, as depicted in FIG. 13, the third dummy capacitor 33 may alternatively be formed in a zigzag pattern as viewed from above. Furthermore, in the foregoing embodiment, the fourth dummy capacitor 34 formed in the scribe region 3 is in a grid pattern as viewed from above. However, as depicted in FIG. 13, the fourth dummy capacitor 34 may be formed in a zigzag pattern as viewed from above. FIG. 13 is a plan view corresponding to FIG. 5.

Further, in the foregoing embodiment, the first dummy capacitor 34 is formed in the nonvolatile logic cell 21 as viewed from above. However, the first dummy capacitor 34 need not always be formed.

Furthermore, the foregoing embodiment is configured so that, within the nonvolatile logic region 13, the second and third dummy capacitors 32 and 33 are formed around the nonvolatile logic cell 21 as viewed from above. However, the second and third dummy capacitors 32 and 33 need not always be formed.

Further, the first to fourth dummy capacitors 31 to 34 need not always be formed.

While the foregoing embodiment has been described on the assumption that the present invention is applied to a semiconductor device having a nonvolatile logic, the present invention is also applicable to a semiconductor device having a ferroelectric random access memory (FeRAM). The ferroelectric random access memory includes a plurality of memory cells. As disclosed, for example, in Patent Document 1, the memory cells each include a field-effect transistor and a ferroelectric capacitor. In this case, each of the memory cells in the ferroelectric random access memory is an example of a nonvolatile memory element according to the present invention.

In a case where the present invention is applied to a semiconductor device having a ferroelectric random access memory, it is possible to replace the nonvolatile logic region 13 in the foregoing embodiment with a ferroelectric random access memory region, and replace the core region 13A in the foregoing embodiment with a core region where a plurality of ferroelectric random access memory cells are formed. In such a case, the same guard ring region 13b and gap region 13C as those in the foregoing embodiment may be disposed in the ferroelectric random access memory region.

Further, various design changes may be made without departing from the scope defined in the appended claims.

DESCRIPTION OF REFERENCE SYMBOLS

1 Semiconductor wafer
2 Functional element region
3 Scribe region
4 Semiconductor device
11 Power transistor region
12 Analog circuit region
13 Nonvolatile logic region
13A Core region
13B Guard ring region
13C Gap region
14 Logic region
15 SRAM region
16 CPU region
17 ROM region
20 Guard ring
21 Nonvolatile logic cell (nonvolatile memory element)
22 Control circuit
23 Volatile memory section
24 Nonvolatile memory section
25 Ferroelectric capacitor (real capacitor)
26 MOSFET
31 First dummy capacitor
32 Second dummy capacitor
33 Third dummy capacitor
34 Fourth dummy capacitor
40 Semiconductor substrate
42 Drain region
43 Source region
44 n$^-$-type high-resistance region
45 Gate insulating film
46 Gate electrode
47 Sidewall
48 p-type diffusion region
49 n-type diffusion region
50 First interlayer insulating film
51 Bottom electrode
52 Ferroelectric film
53 Top electrode
54 Lower electrode layer
55 Upper electrode layer
56 Hydrogen barrier film
57 Second interlayer insulating film
61 to 64 First to fourth contact plugs
65 First contact hole
66 Barrier metal
67 Second contact hole
68 Barrier metal
69 Third contact hole
70 Barrier metal
71 Fourth contact hole
72 Barrier metal
81 to 84 First to fourth via plugs
85 First via hole 86 Barrier metal
87 Second via hole
88 Barrier metal
89 Third via hole
90 Barrier metal
91 Fourth via hole
92 Barrier metal
93 First wiring
94 Second wiring
95 Ground line
96 Power supply line
97 Third interlayer insulating film
98 Fifth via plug
99 Sixth via plug
100 Fifth via hole
101 Barrier metal
102 Sixth via hole
103 Barrier metal
104 Third wiring
105 Fourth wiring
300 Shield ring
301 p-type diffusion region
310 First shield ring
311 Fifth contact plug
312 Fifth dummy capacitor
313 Seventh via plug
314 First common shield wiring
315 Ninth via plug
316 Second common shield wiring
317 Fifth contact hole
318 Barrier metal
319 Seventh via hole
320 Barrier metal
321 Ninth via hole
322 Barrier metal
330 Second shield ring
331 Sixth contact plug
332 Eighth via plug
314 First common shield wiring
333 Tenth via plug
316 Second common shield wiring
334 Sixth contact hole
335 Barrier metal
336 Eighth via hole
337 Barrier metal
338 Tenth via hole
339 Barrier metal

The invention claimed is:

1. A semiconductor device, comprising:
a semiconductor substrate;
an interlayer insulating film that is formed on the semiconductor substrate;
a nonvolatile memory element that includes a real ferroelectric capacitor formed on the interlayer insulating film, wherein
the real ferroelectric capacitor includes:
a first bottom electrode formed on the interlayer insulating film,
a first ferroelectric film formed on the first bottom electrode, and
a first top electrode formed on the first ferroelectric film, and
the first bottom electrode of the real ferroelectric capacitor is electrically connected to the semiconductor substrate through a first plug penetrating the interlayer insulating film;
a shield ring having a ring-like shape as viewed from above,
wherein the shield ring is formed continuously around the semiconductor device and along a scribe region of the semiconductor device in order to prevent entry of moisture; and
a first dummy ferroelectric capacitor formed intermittently around the semiconductor device and along the shield ring, wherein
the shield ring includes a real capacitor oxidation suppression structure,
the real capacitor oxidation suppression structure includes a second dummy ferroelectric capacitor and a second plug,
the second dummy ferroelectric capacitor includes a second bottom electrode, a second ferroelectric film, and a second top electrode,
the second dummy ferroelectric capacitor is not used as the nonvolatile memory element,
the second bottom electrode is formed on the interlayer insulating film,
the second ferroelectric film is formed on the second bottom electrode,
the second top electrode is formed on the second ferroelectric film, and
the second plug penetrates the interlayer insulating film and electrically connects the second bottom electrode to the semiconductor substrate.

2. The semiconductor device according to claim 1, wherein
the nonvolatile memory element further includes a transistor formed on the semiconductor substrate,
the first bottom electrode of the real ferroelectric capacitor is connected to the transistor, and
the second bottom electrode of the second dummy ferroelectric capacitor is not connected to the transistor.

3. The semiconductor device according to claim 1,
wherein the real capacitor oxidation suppression structure is formed in a ring-like or substantially ring-like manner as viewed from above.

4. The semiconductor device according to claim 1,
wherein each of the second dummy ferroelectric capacitor and the second plug has the ring-like shape as viewed from above.

5. The semiconductor device according to claim 1, wherein
the shield ring includes a first shield ring and a second shield ring,
each of the first shield ring and the second shield ring is in the ring-like shape as viewed from above,
the second shield ring is formed so as to surround the first shield ring, and
the real capacitor oxidation suppression structure is formed as a part of the first shield ring.

6. The semiconductor device according to claim 5,
wherein the real capacitor oxidation suppression structure formed as the part of the first shield ring includes the second dummy ferroelectric capacitor having the ring-like shape as viewed from above and the second plug having the ring-like shape as viewed from above.

7. The semiconductor device according to claim 1, wherein
the shield ring includes a first shield ring and a second shield ring,
each of the first shield ring and the second shield ring is in the ring-like shape as viewed from above, the second shield ring is formed so as to surround the first shield ring, and the real capacitor oxidation suppression structure is formed as a part of the second shield ring.

8. The semiconductor device according to claim 7, wherein the real capacitor oxidation suppression structure formed as the part of the second shield ring includes the second dummy ferroelectric capacitor having the ring-like shape as viewed from above and the second plug having the ring-like shape as viewed from above.

9. The semiconductor device according to claim 1, wherein
the shield ring includes a first shield ring and a second shield ring,
each of the first shield ring and the second shield ring is in the ring-like shape as viewed from above,
the second shield ring is formed so as to surround the first shield ring, and
the real capacitor oxidation suppression structure is not only formed as a part of the first shield ring, but also formed as a part of the second shield ring.

10. The semiconductor device according to claim 9, wherein
the real capacitor oxidation suppression structure formed as the part of the first shield ring includes the second dummy ferroelectric capacitor having the ring-like shape as viewed from above and the second plug having the ring-like shape as viewed from above, and
the real capacitor oxidation suppression structure formed as the part of the second shield ring includes a third dummy ferroelectric capacitor having the ring-like shape as viewed from above and a third plug having the ring-like shape as viewed from above.

11. The semiconductor device according to claim 4, further comprising:
when the interlayer insulating film is regarded as a first interlayer insulating film,
a hydrogen barrier film that covers a surface of the real ferroelectric capacitor, a surface of the second dummy ferroelectric capacitor, and a surface of the first interlayer insulating film; and
a second interlayer insulating film that is formed on the hydrogen barrier film,
wherein the shield ring further includes:
a shield wiring that is in the ring-like shape as viewed from above and formed on the second interlayer insulating film, and
a shield plug that is in the ring-like shape as viewed from above, embedded in the second interlayer insulating film, and used to electrically connect a top electrode of the real capacitor oxidation suppression structure to the shield wiring.

12. The semiconductor device according to claim 6, further comprising:
when the interlayer insulating film is regarded as a first interlayer insulating film,
a hydrogen barrier film that covers a surface of the real ferroelectric capacitor, a surface of the second dummy ferroelectric capacitor, and a surface of the first interlayer insulating film; and
a second interlayer insulating film that is formed on the hydrogen barrier film,
wherein the first shield ring further includes:
a shield wiring that is in the ring-like shape as viewed from above and formed on the second interlayer insulating film, and
a shield plug that is in the ring-like shape as viewed from above, embedded in the second interlayer insulating film, and used to electrically connect a top electrode of the real capacitor oxidation suppression structure to the shield wiring.

13. The semiconductor device according to claim 8, further comprising:
when the interlayer insulating film is regarded as a first interlayer insulating film,
a hydrogen barrier film that covers a surface of the real ferroelectric capacitor, a surface of the second dummy ferroelectric capacitor, and a surface of the first interlayer insulating film; and
a second interlayer insulating film that is formed on the hydrogen barrier film,
wherein the second shield ring further includes:
a shield wiring that is in the ring-like shape as viewed from above and formed on the second interlayer insulating film, and
a shield plug that is in the ring-like shape as viewed from above, embedded in the second interlayer insulating film, and used to electrically connect a top electrode of the real capacitor oxidation suppression structure to the shield wiring.

14. The semiconductor device according to claim 8, further comprising:
when the interlayer insulating film is regarded as a first interlayer insulating film,
a hydrogen barrier film that covers a surface of the real ferroelectric capacitor, a surface of the second dummy ferroelectric capacitor, and a surface of the first interlayer insulating film; and
a second interlayer insulating film that is formed on the hydrogen barrier film, wherein
the first shield ring further includes:
a first shield wiring that is in the ring-like shape as viewed from above and formed on the second interlayer insulating film, and
a first shield plug that is in the ring-like shape as viewed from above, embedded in the second interlayer insulating film, and used to electrically connect a top electrode of the real capacitor oxidation suppression structure to the first shield wiring, and
the second shield ring further includes:
a second shield wiring that is in the ring-like shape as viewed from above and formed on the second interlayer insulating film, and
a second shield plug that is in the ring-like shape as viewed from above, embedded in the second interlayer insulating film, and used to electrically connect the top electrode of the real capacitor oxidation suppression structure to the second shield wiring.

15. The semiconductor device according to claim 1, wherein
the semiconductor substrate is of a first conductive type,
the first plug is electrically connected to a second conductive diffusion region formed on a surface layer of the semiconductor substrate, and
the second plug is electrically connected to a first conductive diffusion region formed on the surface layer of the semiconductor substrate.

16. The semiconductor device according to claim 15, wherein the first conductive type is a p-type, and
the second conductive diffusion region is of an n-type.

17. The semiconductor device according to claim 1, wherein
  the nonvolatile memory element is a nonvolatile logic cell that includes a volatile memory section and a nonvolatile memory section,
  the nonvolatile memory section includes the real ferroelectric capacitor, and
  the nonvolatile memory section is configured to retain data of the volatile memory section.

18. The semiconductor device according to claim 1, wherein the nonvolatile memory element is a memory cell in a ferroelectric random access memory.

* * * * *